United States Patent
Chen et al.

(10) Patent No.: US 6,998,014 B2
(45) Date of Patent: Feb. 14, 2006

(54) APPARATUS AND METHOD FOR PLASMA ASSISTED DEPOSITION

(75) Inventors: Chen-An Chen, Milpitas, CA (US); Avgerinos Gelatos, Redwood City, CA (US); Michael X. Yang, Palo Alto, CA (US); Ming Xi, Milpitas, CA (US); Mark M. Hytros, Lake In The Hills, IL (US)

(73) Assignee: Applied Materials, Inc., Santa Clara, CA (US)

( * ) Notice: Subject to any disclaimer, the term of this patent is extended or adjusted under 35 U.S.C. 154(b) by 120 days.

(21) Appl. No.: 10/197,940

(22) Filed: Jul. 16, 2002

(65) Prior Publication Data

US 2003/0143328 A1 Jul. 31, 2003

Related U.S. Application Data

(60) Provisional application No. 60/352,191, filed on Jan. 26, 2002.

(51) Int. Cl.
*C23F 1/00* (2006.01)
*H01L 21/306* (2006.01)

(52) U.S. Cl. .................. 156/345.34; 156/345.33; 156/345.43; 156/345.44; 156/345.47; 118/723 R; 118/723 E; 118/723 ER

(58) Field of Classification Search ............ 118/723 E, 118/723 R, 723 ER; 156/345.47, 345.43
See application file for complete search history.

(56) References Cited

U.S. PATENT DOCUMENTS

| | | | |
|---|---|---|---|
| 4,058,430 A | 11/1977 | Suntola et al. | 156/611 |
| 4,389,973 A | 6/1983 | Suntola et al. | 118/725 |
| 4,413,022 A | 11/1983 | Suntola et al. | 427/255.2 |

(Continued)

FOREIGN PATENT DOCUMENTS

| | | |
|---|---|---|
| DE | 19820147 | 7/1999 |
| DE | 19627017 | 1/2000 |
| EP | 0 344 352 | 12/1989 |

(Continued)

OTHER PUBLICATIONS

Yang, et al. "Atomic Layer Deposition of Tungsten Film from WF6/B2H6: Nucleation Layer for Advanced Semiconductor Device," Conference Proceedings ULSI XVII (2002) Materials Research Society.

(Continued)

*Primary Examiner*—Parviz Hassanzadeh
*Assistant Examiner*—Maureen G. Arancibia
(74) *Attorney, Agent, or Firm*—Moser Patterson & Sheridan, LLP

(57) ABSTRACT

Embodiments of the present invention relate to an apparatus and method of plasma assisted deposition by generation of a plasma adjacent a processing region. One embodiment of the apparatus comprises a substrate processing chamber including a top shower plate, a power source coupled to the top shower plate, a bottom shower plate, and an insulator disposed between the top shower plate and the bottom shower plate. In one aspect, the power source is adapted to selectively provide power to the top shower plate to generate a plasma from the gases between the top shower plate and the bottom shower plate. In another embodiment, a power source is coupled to the top shower plate and the bottom shower plate to generate a plasma between the bottom shower plate and the substrate support. One embodiment of the method comprises performing in a single chamber one or more of the processes including, but not limited to, cyclical layer deposition, combined cyclical layer deposition and plasma-enhanced chemical vapor deposition; plasma-enhanced chemical vapor deposition; and/or chemical vapor deposition.

17 Claims, 9 Drawing Sheets

U.S. PATENT DOCUMENTS

| | | | |
|---|---|---|---|
| 4,486,487 A | 12/1984 | Skarp | 428/216 |
| 4,767,494 A | 8/1988 | Kobayashi et al. | 156/606 |
| 4,806,321 A | 2/1989 | Nishizawa et al. | 422/245 |
| 4,813,846 A | 3/1989 | Helms | 414/744.1 |
| 4,834,831 A | 5/1989 | Nishizawa et al. | 156/611 |
| 4,838,983 A | 6/1989 | Schumaker et al. | 156/613 |
| 4,838,993 A | 6/1989 | Aoki et al. | 156/643 |
| 4,839,022 A | 6/1989 | Skinner | 437/107 |
| 4,840,921 A | 6/1989 | Matsumoto | 437/89 |
| 4,845,049 A | 7/1989 | Sunakawa | 437/81 |
| 4,859,627 A | 8/1989 | Sunakawa | 437/81 |
| 4,861,417 A | 8/1989 | Mochizuki et al. | 156/610 |
| 4,876,218 A | 10/1989 | Pessa et al. | 437/107 |
| 4,917,556 A | 4/1990 | Stark et al. | 414/217 |
| 4,927,670 A | 5/1990 | Erbil | 427/255.3 |
| 4,931,132 A | 6/1990 | Aspnes et al. | 156/601 |
| 4,951,601 A | 8/1990 | Maydan et al. | 118/719 |
| 4,960,720 A | 10/1990 | Shimbo | 437/105 |
| 4,975,252 A | 12/1990 | Nishizawa et al. | 422/245 |
| 4,993,357 A | 2/1991 | Scholz | 118/715 |
| 5,000,113 A | 3/1991 | Wang et al. | 118/723 |
| 5,013,683 A | 5/1991 | Petroff et al. | 437/110 |
| 5,028,565 A | 7/1991 | Chang et al. | 437/192 |
| 5,082,798 A | 1/1992 | Arimoto | 437/108 |
| 5,085,885 A | 2/1992 | Foley et al. | 477/38 |
| 5,091,320 A | 2/1992 | Aspnes et al. | 437/8 |
| 5,130,269 A | 7/1992 | Kitahara et al. | 437/111 |
| 5,166,092 A | 11/1992 | Mochizuki et al. | 437/105 |
| 5,173,474 A | 12/1992 | Connell et al. | 505/1 |
| 5,186,718 A | 2/1993 | Tepman et al. | 29/25.01 |
| 5,205,077 A | 4/1993 | Wittstock | 51/165 R |
| 5,225,366 A | 7/1993 | Yoder | 437/108 |
| 5,234,561 A | 8/1993 | Randhawa et al. | 204/192.38 |
| 5,246,536 A | 9/1993 | Nishizawa et al. | 156/610 |
| 5,250,148 A | 10/1993 | Nishizawa et al. | 156/611 |
| 5,254,207 A | 10/1993 | Nishizawa et al. | 156/601 |
| 5,256,244 A | 10/1993 | Ackerman et al. | 156/613 |
| 5,259,881 A | 11/1993 | Edwards et al. | 118/719 |
| 5,270,247 A | 12/1993 | Sakuma et al. | 437/133 |
| 5,278,435 A | 1/1994 | Van Hove et al. | 257/184 |
| 5,281,274 A | 1/1994 | Yoder | 118/697 |
| 5,286,296 A | 2/1994 | Sato et al. | 118/719 |
| 5,290,748 A | 3/1994 | Knuuttila et al. | 502/228 |
| 5,294,286 A | 3/1994 | Nishizawa et al. | 156/610 |
| 5,296,403 A | 3/1994 | Nishizawa et al. | 437/133 |
| 5,300,186 A | 4/1994 | Kitahara et al. | 156/631 |
| 5,306,666 A | 4/1994 | Izumi | 437/192 |
| 5,311,055 A | 5/1994 | Goodman et al. | 257/593 |
| 5,316,615 A | 5/1994 | Copel et al. | 117/95 |
| 5,316,793 A | 5/1994 | Wallace et al. | 427/248.1 |
| 5,330,610 A | 7/1994 | Eres et al. | 117/86 |
| 5,336,324 A | 8/1994 | Stall et al. | 118/719 |
| 5,338,389 A | 8/1994 | Nishizawa et al. | 117/89 |
| 5,344,792 A * | 9/1994 | Sandhu et al. | 438/660 |
| 5,348,911 A | 9/1994 | Jurgensen et al. | 117/91 |
| 5,374,570 A | 12/1994 | Nasu et al. | 437/40 |
| 5,395,791 A | 3/1995 | Cheng et al. | 437/105 |
| 5,439,876 A | 8/1995 | Graf et al. | 505/447 |
| 5,439,952 A | 8/1995 | Lum et al. | 117/84 |
| 5,441,703 A | 8/1995 | Jurgensen | 422/129 |
| 5,443,033 A | 8/1995 | Nishizawa et al. | 117/86 |
| 5,443,647 A | 8/1995 | Aucoin et al. | 118/723 RE |
| 5,455,072 A | 10/1995 | Bension et al. | 427/255.7 |
| 5,458,084 A | 10/1995 | Thorne et al. | 117/89 |
| 5,469,806 A | 11/1995 | Mochizuki et al. | 117/97 |
| 5,480,818 A | 1/1996 | Matsumoto et al. | 437/40 |
| 5,483,919 A | 1/1996 | Yokoyama et al. | 117/89 |
| 5,484,664 A | 1/1996 | Kitahara et al. | |
| 5,503,875 A | 4/1996 | Imai et al. | 427/255.3 |
| 5,521,126 A | 5/1996 | Okamura et al. | 437/235 |
| 5,526,244 A | 6/1996 | Bishop | 362/147 |
| 5,527,733 A | 6/1996 | Nishizawa et al. | 437/160 |
| 5,532,511 A | 7/1996 | Nishizawa et al. | 257/627 |
| 5,540,783 A | 7/1996 | Eres et al. | 118/725 |
| 5,580,380 A | 12/1996 | Liu et al. | 117/86 |
| 5,595,784 A | 1/1997 | Kaim et al. | 427/255.2 |
| 5,601,651 A | 2/1997 | Watabe | 118/715 |
| 5,609,689 A | 3/1997 | Kato et al. | 118/719 |
| 5,616,181 A | 4/1997 | Yamamoto et al. | 118/723 R |
| 5,637,530 A | 6/1997 | Gaines et al. | 114/105 |
| 5,641,984 A | 6/1997 | Aftergut et al. | 257/433 |
| 5,644,128 A | 7/1997 | Wollnik et al. | 250/251 |
| 5,667,592 A | 9/1997 | Boitnott et al. | 118/719 |
| 5,674,786 A | 10/1997 | Turner et al. | 437/225 |
| 5,693,139 A | 12/1997 | Nishizawa et al. | 117/89 |
| 5,695,564 A | 12/1997 | Imahashi | 118/719 |
| 5,705,224 A | 1/1998 | Murota et al. | 427/248.1 |
| 5,707,880 A | 1/1998 | Aftergut et al. | 437/3 |
| 5,711,811 A | 1/1998 | Suntola et al. | 118/711 |
| 5,730,801 A | 3/1998 | Tepman et al. | 118/719 |
| 5,730,802 A | 3/1998 | Ishizumi et al. | 118/719 |
| 5,747,113 A | 5/1998 | Tsai | 427/255.5 |
| 5,749,974 A | 5/1998 | Habuka et al. | 118/725 |
| 5,788,447 A | 8/1998 | Yonemitsu et al. | 414/217 |
| 5,788,799 A | 8/1998 | Steger et al. | 156/345 |
| 5,796,116 A | 8/1998 | Nakata et al. | 257/66 |
| 5,801,634 A | 9/1998 | Young et al. | 340/635 |
| 5,807,792 A | 9/1998 | Ilg et al. | 438/758 |
| 5,830,270 A | 11/1998 | McKee et al. | 117/106 |
| 5,835,677 A | 11/1998 | Li et al. | 392/401 |
| 5,851,849 A | 12/1998 | Comizzoli et al. | 438/38 |
| 5,855,675 A | 1/1999 | Doering et al. | 118/719 |
| 5,855,680 A | 1/1999 | Soininen et al. | 118/719 |
| 5,858,102 A | 1/1999 | Tsai | 118/719 |
| 5,863,339 A * | 1/1999 | Usami | 118/723 E |
| 5,865,219 A | 2/1999 | Lee et al. | 139/383 A |
| 5,866,795 A | 2/1999 | Wang et al. | 73/1.36 |
| 5,879,459 A | 3/1999 | Gadgil et al. | 118/715 |
| 5,882,165 A | 3/1999 | Maydan et al. | 414/217 |
| 5,882,413 A | 3/1999 | Beaulieu et al. | 118/719 |
| 5,886,213 A | 3/1999 | Kent et al. | 427/573 |
| 5,904,565 A | 5/1999 | Nguyen et al. | 438/687 |
| 5,916,365 A | 6/1999 | Sherman | 117/92 |
| 5,923,056 A | 7/1999 | Lee et al. | 257/192 |
| 5,923,985 A | 7/1999 | Aoki et al. | 438/301 |
| 5,925,574 A | 7/1999 | Aoki et al. | 437/31 |
| 5,928,389 A | 7/1999 | Jevtic | 29/25.01 |
| 5,942,040 A | 8/1999 | Kim et al. | 118/726 |
| 5,947,710 A | 9/1999 | Cooper et al. | 418/63 |
| 5,972,430 A | 10/1999 | DiMeo, Jr. et al. | 427/255.32 |
| 6,001,669 A | 12/1999 | Gaines et al. | 438/102 |
| 6,015,590 A | 1/2000 | Suntola et al. | 427/255.23 |
| 6,015,917 A | 1/2000 | Bhandari et al. | 556/12 |
| 6,025,627 A | 2/2000 | Forbes et al. | 257/321 |
| 6,036,733 A | 3/2000 | Holz et al. | 117/97 |
| 6,042,652 A | 3/2000 | Hyun et al. | 118/719 |
| 6,043,177 A | 3/2000 | Falconer et al. | 502/4 |
| 6,051,286 A | 4/2000 | Zhao et al. | 427/576 |
| 6,057,229 A | 5/2000 | Hieber et al. | 438/630 |
| 6,062,798 A | 5/2000 | Muka | 414/416 |
| 6,071,808 A | 6/2000 | Merchant et al. | 438/633 |
| 6,081,034 A | 6/2000 | Sandhu et al. | 257/764 |
| 6,084,302 A | 7/2000 | Sandhu | 257/751 |
| 6,086,677 A * | 7/2000 | Umotoy et al. | 118/715 |
| 6,110,556 A | 8/2000 | Bang et al. | 428/64.1 |
| 6,113,977 A | 9/2000 | Soininen et al. | 427/64 |
| 6,117,244 A | 9/2000 | Bang et al. | 118/715 |
| 6,124,158 A | 9/2000 | Dautartas et al. | 438/216 |
| 6,130,147 A | 10/2000 | Major et al. | 438/604 |
| 6,139,700 A | 10/2000 | Kang et al. | 204/192.17 |
| 6,140,238 A | 10/2000 | Kitch | 438/687 |

| Patent/Pub No. | Date | Inventor(s) | Class |
|---|---|---|---|
| 6,140,247 A | 10/2000 | Muraoka et al. | 438/743 |
| 6,143,659 A | 11/2000 | Leem | 438/688 |
| 6,144,060 A | 11/2000 | Park et al. | 257/310 |
| 6,158,446 A | 12/2000 | Mohindra et al. | 134/25.4 |
| 6,174,377 B1 | 1/2001 | Doering et al. | 118/729 |
| 6,174,809 B1 | 1/2001 | Kang et al. | 438/682 |
| 6,183,563 B1 | 2/2001 | Choi et al. | 118/715 |
| 6,197,683 B1 | 3/2001 | Kang et al. | 438/643 |
| 6,200,893 B1 | 3/2001 | Sneh | 438/685 |
| 6,203,613 B1 | 3/2001 | Gates et al. | 117/104 |
| 6,206,967 B1 | 3/2001 | Mak et al. | 118/666 |
| 6,207,302 B1 | 3/2001 | Sugiura et al. | 428/690 |
| 6,207,487 B1 | 3/2001 | Kim et al. | 438/238 |
| 6,214,714 B1 | 4/2001 | Wang et al. | 438/592 |
| 6,231,672 B1 | 5/2001 | Choi et al. | 118/715 |
| 6,248,605 B1 | 6/2001 | Harkonen et al. | 438/29 |
| 6,270,572 B1 | 8/2001 | Kim et al. | 117/93 |
| 6,271,148 B1 | 8/2001 | Kao et al. | 438/727 |
| 6,284,646 B1 | 9/2001 | Leem | 438/629 |
| 6,287,965 B1 | 9/2001 | Kang et al. | 438/648 |
| 6,291,876 B1 | 9/2001 | Stumborg et al. | 257/632 |
| 6,305,314 B1 | 10/2001 | Sneh et al. | 118/723 R |
| 6,306,216 B1 | 10/2001 | Kim et al. | 118/725 |
| 6,316,098 B1 | 11/2001 | Yitzchaik et al. | 428/339 |
| 6,333,260 B1 | 12/2001 | Kwon et al. | 438/643 |
| 6,342,277 B1 | 1/2002 | Sherman | 427/562 |
| 6,348,376 B1 | 2/2002 | Lim et al. | 438/253 |
| 6,355,561 B1 | 3/2002 | Sandhu et al. | 438/676 |
| 6,358,829 B1 | 3/2002 | Yoon et al. | 438/597 |
| 6,368,954 B1 | 4/2002 | Lopatin et al. | 438/627 |
| 6,369,430 B1 | 4/2002 | Adetutu et al. | 257/382 |
| 6,372,598 B1 | 4/2002 | Kang et al. | 438/399 |
| 6,379,748 B1 | 4/2002 | Bhandari et al. | 427/255.394 |
| 6,391,785 B1 | 5/2002 | Satta et al. | 438/704 |
| 6,399,491 B1 | 6/2002 | Jeon et al. | 438/680 |
| 6,416,577 B1 | 7/2002 | Suntoloa et al. | 117/88 |
| 6,416,822 B1 | 7/2002 | Chiang et al. | 427/561 |
| 6,420,189 B1 | 7/2002 | Lopatin | 438/2 |
| 6,423,619 B1 | 7/2002 | Grant et al. | 438/589 |
| 6,428,859 B1 | 8/2002 | Chiang et al. | 427/457 |
| 6,447,607 B1 | 9/2002 | Soininen et al. | 117/200 |
| 6,447,933 B1 | 9/2002 | Wang et al. | 428/635 |
| 6,451,119 B1 | 9/2002 | Sneh et al. | 118/715 |
| 6,451,695 B1 | 9/2002 | Sneh | 438/685 |
| 6,458,701 B1 | 10/2002 | Chae et al. | 438/680 |
| 6,468,924 B1 | 10/2002 | Lee et al. | 438/763 |
| 6,475,276 B1 | 11/2002 | Elers et al. | 117/84 |
| 6,475,910 B1 | 11/2002 | Sneh | 438/685 |
| 6,478,872 B1 | 11/2002 | Chae et al. | 117/88 |
| 6,481,945 B1 | 11/2002 | Hasper et al. | 414/217 |
| 6,482,262 B1 | 11/2002 | Elers et al. | 117/84 |
| 6,482,733 B1 | 11/2002 | Raaijmakers et al. | 438/633 |
| 6,482,740 B1 | 11/2002 | Soininen et al. | 438/686 |
| 6,511,539 B1 | 1/2003 | Raaijmakers | 117/102 |
| 6,534,395 B1 | 3/2003 | Werkhoven et al. | 438/627 |
| 6,548,424 B1 | 4/2003 | Putkonen | 438/785 |
| 6,551,406 B1 | 4/2003 | Kilpi | 118/728 |
| 6,551,929 B1 | 4/2003 | Kori et al. | 438/685 |
| 6,569,501 B1 | 5/2003 | Chiang et al. | |
| 6,607,976 B1 | 8/2003 | Chen et al. | 438/627 |
| 6,616,986 B1 | 9/2003 | Sherman | |
| 6,630,201 B1 | 10/2003 | Chiang et al. | |
| 2001/0000866 A1 | 5/2001 | Sneh et al. | 118/723 R |
| 2001/0002280 A1 | 5/2001 | Sneh | 427/255.28 |
| 2001/0009140 A1 | 7/2001 | Bondestam et al. | 118/725 |
| 2001/0009695 A1 | 7/2001 | Saanila et al. | 427/255.39 |
| 2001/0011526 A1 | 8/2001 | Doering et al. | 118/729 |
| 2001/0013312 A1 | 8/2001 | Soininen et al. | 117/86 |
| 2001/0014371 A1 | 8/2001 | Kilpi | 427/255.28 |
| 2001/0024387 A1 | 9/2001 | Raaijmakers et al. | 365/200 |
| 2001/0025979 A1 | 10/2001 | Kim et al. | 257/315 |
| 2001/0028924 A1 | 10/2001 | Sherman | 427/255.28 |
| 2001/0029094 A1 | 10/2001 | Mee-Young et al. | 438/597 |
| 2001/0034123 A1 | 10/2001 | Jeon et al. | 438/643 |
| 2001/0041250 A1 | 11/2001 | Werkhoven et al. | 428/212 |
| 2001/0042523 A1 | 11/2001 | Kesala | 122/6.6 |
| 2001/0042799 A1 | 11/2001 | Kim et al. | 239/553 |
| 2001/0050039 A1 | 12/2001 | Park | 117/102 |
| 2001/0054377 A1 | 12/2001 | Lindfors et al. | 117/104 |
| 2001/0054730 A1 | 12/2001 | Kim et al. | 257/301 |
| 2001/0054769 A1 | 12/2001 | Raaijmakers et al. | 257/758 |
| 2002/0000196 A1 | 1/2002 | Park | 118/715 |
| 2002/0000598 A1 | 1/2002 | Kang et al. | 257/301 |
| 2002/0004293 A1 | 1/2002 | Soininen et al. | 438/584 |
| 2002/0007790 A1 | 1/2002 | Park | 118/715 |
| 2002/0019121 A1 | 2/2002 | Pyo | 438/618 |
| 2002/0020869 A1 | 2/2002 | Park et al. | 257/306 |
| 2002/0021544 A1 | 2/2002 | Cho et al. | 361/200 |
| 2002/0031618 A1 | 3/2002 | Sherman | 427/569 |
| 2002/0037630 A1 | 3/2002 | Agarwal et al. | 438/430 |
| 2002/0041931 A1 | 4/2002 | Suntola et al. | 427/255.28 |
| 2002/0047151 A1 | 4/2002 | Kim et al. | |
| 2002/0048635 A1 | 4/2002 | Kim et al. | 427/331 |
| 2002/0048880 A1 | 4/2002 | Lee | 438/253 |
| 2002/0052097 A1 | 5/2002 | Park | 438/507 |
| 2002/0055235 A1 | 5/2002 | Agarwal et al. | 438/430 |
| 2002/0061612 A1 | 5/2002 | Sandhu et al. | 438/151 |
| 2002/0066411 A1 | 6/2002 | Chiang et al. | 118/724 |
| 2002/0068458 A1 | 6/2002 | Chiang et al. | 438/694 |
| 2002/0073924 A1 | 6/2002 | Chiang et al. | 118/723 R |
| 2002/0074588 A1 | 6/2002 | Lee | 257/306 |
| 2002/0076481 A1 | 6/2002 | Chiang et al. | 427/8 |
| 2002/0076490 A1 | 6/2002 | Chiang et al. | |
| 2002/0076507 A1 | 6/2002 | Chiang et al. | 427/569 |
| 2002/0076508 A1 | 6/2002 | Chiang et al. | 427/569 |
| 2002/0076837 A1 | 6/2002 | Hujanen et al. | 438/3 |
| 2002/0081844 A1 | 6/2002 | Jeon et al. | 438/680 |
| 2002/0086106 A1 | 7/2002 | Park et al. | 427/248.1 |
| 2002/0090829 A1 | 7/2002 | Sandhu et al. | 438/761 |
| 2002/0092471 A1 | 7/2002 | Kang et al. | 118/715 |
| 2002/0094689 A1 | 7/2002 | Park | 438/694 |
| 2002/0098627 A1 | 7/2002 | Pomarede et al. | 438/149 |
| 2002/0104481 A1 | 8/2002 | Chiang et al. | 118/723 R |
| 2002/0105088 A1 | 8/2002 | Yang et al. | 257/774 |
| 2002/0106536 A1 | 8/2002 | Lee et al. | 428/702 |
| 2002/0106846 A1 | 8/2002 | Seutter et al. | 438/200 |
| 2002/0108570 A1 | 8/2002 | Lindfors | 118/715 |
| 2002/0109168 A1 | 8/2002 | Kim et al. | 257/295 |
| 2002/0117399 A1 | 8/2002 | Chen et al. | 205/125 |
| 2002/0121241 A1 | 9/2002 | Nguyen et al. | 118/715 |
| 2002/0121342 A1 | 9/2002 | Nguyen et al. | 156/345.33 |
| 2002/0121697 A1 | 9/2002 | Marsh | 257/751 |
| 2002/0134307 A1 | 9/2002 | Choi | 118/715 |
| 2002/0135071 A1 | 9/2002 | Kang et al. | 257/767 |
| 2002/0144655 A1 | 10/2002 | Chiang et al. | 118/715 |
| 2002/0144657 A1 | 10/2002 | Chiang et al. | 118/723 R |
| 2002/0144786 A1 | 10/2002 | Chiang et al. | |
| 2002/0146511 A1 | 10/2002 | Chiang et al. | 427/248.1 |
| 2002/0155722 A1 | 10/2002 | Satta et al. | 438/704 |
| 2002/0162506 A1 | 11/2002 | Sneh et al. | 118/715 |
| 2002/0164421 A1 | 11/2002 | Chiang et al. | 427/248.1 |
| 2002/0164423 A1 | 11/2002 | Chiang et al. | 427/255.28 |
| 2002/0177282 A1 | 11/2002 | Song | 438/300 |
| 2002/0182320 A1 | 12/2002 | Leskela et al. | 427/250 |
| 2002/0187256 A1 | 12/2002 | Elers et al. | 427/99 |
| 2002/0187631 A1 | 12/2002 | Kim et al. | 438/637 |
| 2002/0196591 A1 | 12/2002 | Hujanen et al. | |
| 2002/0197402 A1 | 12/2002 | Chiang et al. | 427/255.39 |
| 2002/0197831 A1 | 12/2002 | Todd et al. | |
| 2003/0004723 A1 | 1/2003 | Chihara | 704/260 |
| 2003/0010451 A1 | 1/2003 | Tzu et al. | 156/345.33 |
| 2003/0013300 A1 | 1/2003 | Byun | 438/680 |

| | | | | | |
|---|---|---|---|---|---|
| 2003/0013320 A1 | 1/2003 | Kim et al. ............... 438/778 | JP | 12-90222 | 11/1989 |
| 2003/0031807 A1 | 2/2003 | Elers et al. ............. 427/569 | JP | 12-96673 | 11/1989 |
| 2003/0032281 A1 | 2/2003 | Werkhoven et al. ...... 438/640 | JP | 13-03770 | 12/1989 |
| 2003/0042630 A1 | 3/2003 | Babcoke et al. ......... 261/121.1 | JP | 13-05894 | 12/1989 |
| 2003/0049942 A1 | 3/2003 | Haukka et al. .......... 438/778 | JP | 13-13927 | 12/1989 |
| 2003/0054631 A1 | 3/2003 | Raaijmakers et al. .... 438/633 | JP | 20-12814 | 1/1990 |
| 2003/0072975 A1 | 4/2003 | Shero et al. ............ 428/704 | JP | 20-14513 | 1/1990 |
| 2003/0075273 A1 | 4/2003 | Kilpela et al. .......... 156/345.33 | JP | 20-17634 | 1/1990 |
| 2003/0075925 A1 | 4/2003 | Lindfors et al. ......... 285/367 | JP | 20-63115 | 3/1990 |
| 2003/0079686 A1 | 5/2003 | Chen et al. ............. 118/715 | JP | 20-74029 | 3/1990 |
| 2003/0082296 A1 | 5/2003 | Elers et al. ............. 427/96 | JP | 20-74587 | 3/1990 |
| 2003/0082300 A1 | 5/2003 | Todd et al. ............. 427/255.27 | JP | 21-06822 | 4/1990 |
| 2003/0106643 A1 * | 6/2003 | Tabuchi et al. ......... 156/345.35 | JP | 21-29913 | 5/1990 |
| 2003/0121469 A1 | 7/2003 | Lindfors et al. ......... 117/105 | JP | 21-62717 | 6/1990 |
| 2003/0129826 A1 | 7/2003 | Werkhoven et al. ...... 438/627 | JP | 21-72895 | 7/1990 |
| 2003/0134508 A1 | 7/2003 | Raaijmakers et al. .... 438/638 | JP | 21-96092 | 8/1990 |
| 2003/0140854 A1 | 7/2003 | Kilpi ...................... 118/715 | JP | 22-03517 | 8/1990 |
| 2003/0143747 A1 | 7/2003 | Bondestam et al. ...... 436/34 | JP | 22-30690 | 9/1990 |
| 2003/0143839 A1 | 7/2003 | Raaijmakers et al. .... 438/633 | JP | 22-30722 | 9/1990 |
| 2003/0143841 A1 | 7/2003 | Yang et al. ............. 438/656 | JP | 22-46161 | 9/1990 |
| 2003/0143867 A1 | 7/2003 | Matsuki et al. | JP | 22-64491 | 10/1990 |
| 2003/0165615 A1 | 9/2003 | Aaltonen et al. ......... 427/79 | JP | 22-83084 | 11/1990 |
| | | | JP | 23-04619 | 12/1990 |

FOREIGN PATENT DOCUMENTS

| | | | | | |
|---|---|---|---|---|---|
| | | | JP | 30-19211 | 1/1991 |
| EP | 0 429 270 | 5/1991 | JP | 30-22569 | 1/1991 |
| EP | 0 799 641 | 10/1997 | JP | 30-23294 | 1/1991 |
| EP | 1 167 569 | 1/2002 | JP | 30-23299 | 1/1991 |
| FR | 2 626 110 | 7/1989 | JP | 30-44967 | 2/1991 |
| FR | 2 692 597 | 12/1993 | JP | 30-48421 | 3/1991 |
| GB | 2 332 980 | 7/1999 | JP | 31-85716 | 8/1991 |
| GB | 2 355 727 | 5/2001 | JP | 32-08885 | 9/1991 |
| JP | 58-097917 | 6/1983 | JP | 32-34025 | 10/1991 |
| JP | 58-100419 | 6/1983 | JP | 32-86522 | 12/1991 |
| JP | 60-065712 | 4/1985 | JP | 32-86531 | 12/1991 |
| JP | 61-035847 | 2/1986 | JP | 40-31391 | 2/1992 |
| JP | 61-210623 | 9/1986 | JP | 40-31396 | 2/1992 |
| JP | 62-069508 | 3/1987 | JP | 41-00292 | 4/1992 |
| JP | 62-091495 | 4/1987 | JP | 41-11418 | 4/1992 |
| JP | 62-141717 | 6/1987 | JP | 41-32214 | 5/1992 |
| JP | 62-167297 | 7/1987 | JP | 41-32681 | 5/1992 |
| JP | 62-171999 | 7/1987 | JP | 41-51822 | 5/1992 |
| JP | 62-232919 | 10/1987 | JP | 41-62418 | 6/1992 |
| JP | 63-062313 | 3/1988 | JP | 41-75299 | 6/1992 |
| JP | 63-085098 | 4/1988 | JP | 41-86824 | 7/1992 |
| JP | 63-090833 | 4/1988 | JP | 42-12411 | 8/1992 |
| JP | 63-222420 | 9/1988 | JP | 42-60696 | 9/1992 |
| JP | 63-222421 | 9/1988 | JP | 42-73120 | 9/1992 |
| JP | 63-227007 | 9/1988 | JP | 42-91916 | 9/1992 |
| JP | 63-252420 | 10/1988 | JP | 42-85167 | 10/1992 |
| JP | 63-266814 | 11/1988 | JP | 43-25500 | 11/1992 |
| JP | 10-09895 | 1/1989 | JP | 43-28874 | 11/1992 |
| JP | 10-09896 | 1/1989 | JP | 50-29228 | 2/1993 |
| JP | 10-09897 | 1/1989 | JP | 50-47666 | 2/1993 |
| JP | 10-37832 | 2/1989 | JP | 50-47668 | 2/1993 |
| JP | 10-82517 | 3/1989 | JP | 50-74717 | 3/1993 |
| JP | 10-82615 | 3/1989 | JP | 50-74724 | 3/1993 |
| JP | 10-82671 | 3/1989 | JP | 51-02189 | 4/1993 |
| JP | 10-82676 | 3/1989 | JP | 51-60152 | 6/1993 |
| JP | 10-90524 | 4/1989 | JP | 51-75143 | 7/1993 |
| JP | 11-03982 | 4/1989 | JP | 51-75145 | 7/1993 |
| JP | 11-03996 | 4/1989 | JP | 51/82906 | 7/1993 |
| JP | 11-17017 | 5/1989 | JP | 51/86295 | 7/1993 |
| JP | 11-43221 | 6/1989 | JP | 52-06036 | 8/1993 |
| JP | 11-43233 | 6/1989 | JP | 52-34899 | 9/1993 |
| JP | 11-54511 | 6/1989 | JP | 52-35047 | 9/1993 |
| JP | 12-45512 | 9/1989 | JP | 52-51339 | 9/1993 |
| JP | 12-36657 | 10/1989 | JP | 52-70997 | 10/1993 |
| JP | 12-64218 | 10/1989 | JP | 52-83339 | 10/1993 |
| JP | 12-70593 | 10/1989 | JP | 52-91152 | 11/1993 |
| JP | 12-72108 | 10/1989 | JP | 53-04334 | 11/1993 |
| JP | 12-90221 | 11/1989 | JP | 53-43327 | 12/1993 |

| | | |
|---|---|---|
| JP | 53-43685 | 12/1993 |
| JP | 60-45606 | 2/1994 |
| JP | 62-24138 | 5/1994 |
| JP | 61-77381 | 6/1994 |
| JP | 61-96809 | 7/1994 |
| JP | 62-22388 | 8/1994 |
| JP | 62-30421 | 8/1994 |
| JP | 62-52057 | 9/1994 |
| JP | 62-91048 | 10/1994 |
| JP | 70-70752 | 3/1995 |
| JP | 70-86269 | 3/1995 |
| JP | 61-32236 | 7/1995 |
| JP | 81-81076 | 7/1996 |
| JP | 82-45291 | 9/1996 |
| JP | 82-64530 | 10/1996 |
| JP | 92-60786 | 10/1997 |
| JP | 92-93681 | 11/1997 |
| JP | 10-190128 | 7/1998 |
| JP | 11-269652 | 10/1999 |
| JP | 2000-005877 | 1/2000 |
| JP | 2000-031387 | 1/2000 |
| JP | 2000-068072 | 3/2000 |
| JP | 2000-319772 | 3/2000 |
| JP | 2000-138094 | 5/2000 |
| JP | 2000-178735 | 6/2000 |
| JP | 2000-218445 | 8/2000 |
| JP | 2001-020075 | 11/2000 |
| JP | 2000-340883 | 12/2000 |
| JP | 2000-353666 | 12/2000 |
| JP | 10-308283 | 3/2001 |
| JP | 2001-062244 | 3/2001 |
| JP | 2001-152339 | 4/2001 |
| JP | 2001-189312 | 5/2001 |
| JP | 2000-087029 | 6/2001 |
| JP | 2001-172767 | 6/2001 |
| JP | 2001-217206 | 8/2001 |
| JP | 2001-220287 | 8/2001 |
| JP | 2001-220294 | 8/2001 |
| JP | 2001-240972 | 9/2001 |
| JP | 2001-254181 | 9/2001 |
| JP | 2001-284042 | 10/2001 |
| JP | 2001-303251 | 10/2001 |
| JP | 2001-328900 | 11/2001 |
| JP | 10-188840 | 12/2001 |
| JP | 2001-111000 | 12/2002 |
| WO | 90/02216 | 3/1990 |
| WO | 91/10510 | 7/1991 |
| WO | 93/02110 | 2/1993 |
| WO | 96/17107 | 6/1996 |
| WO | 96/18756 | 6/1996 |
| WO | 98/06889 | 2/1998 |
| WO | 98/51838 | 11/1998 |
| WO | 99/01595 | 1/1999 |
| WO | WO 99/17335 A1 * | 4/1999 |
| WO | 99/29924 | 6/1999 |
| WO | 99/41423 | 8/1999 |
| WO | 99/65064 | 12/1999 |
| WO | 00/11721 | 3/2000 |
| WO | 00/15865 | 3/2000 |
| WO | 00/15881 | 3/2000 |
| WO | 00/16377 | 3/2000 |
| WO | 00/54320 | 9/2000 |
| WO | 00/63957 | 10/2000 |
| WO | 00/79019 | 12/2000 |
| WO | 00/79576 | 12/2000 |
| WO | 01/15220 | 3/2001 |
| WO | 01/17692 | 3/2001 |
| WO | 01/27346 | 4/2001 |
| WO | 01/27347 | 4/2001 |
| WO | 01/29280 | 4/2001 |
| WO | 01/29891 | 4/2001 |
| WO | 01/29893 | 4/2001 |
| WO | 01/36702 | 5/2001 |
| WO | 01/40541 | 6/2001 |
| WO | 01/66832 | 9/2001 |
| WO | 02/01628 | 1/2002 |
| WO | 02/08485 | 1/2002 |
| WO | 02/08488 | 1/2002 |
| WO | 99/13504 | 1/2002 |
| WO | 02/43115 | 5/2002 |
| WO | 02/45167 | 6/2002 |
| WO | 02/067319 | 8/2002 |

OTHER PUBLICATIONS

Rossnagel, et al. "Plasma–enhanced Atomic Layer Deposition of Ta and Ti for Interconnect Diffusion Barriers," J. Vac. Sci. Technol. B., vol. 18, No. 4 (Jul. 2000); p2016–20.

Ritala, M., et al., "Chemical Vapor Deposition," Jan. 1999, p. 6–9.

Ritala, et al. "Surface Roughness Reduction in Atomic Layer Epitaxy Growth of Titanium Dioxide Thin Films," Thin Solid–Films, vol. 249, No. 2 (Sep. 15, 1994), pp. 155–162.

Ritala, et al. "Perfectly Conformal TiN and $Al_2O_3$ Films Deposited by Atomic Layer Deposition," Chem. Vap. Deposition 1999, 5, No. 1.

Ritala, et al. "Growth of Titanium Dioxide Thin Films by Atomic Layer Epitaxy," Thin Solid Films, vol. 225, No. 1–2 (Mar. 25, 1993) pp. 288–295.

Ritala, et al. "Effects of Intermediate Zinc Pulses on Properties of TiN and NbN Films by Atomic Layer Epitaxy," Applied Surface Science, vol. 120, No. 3–4, (Dec. 1997), pp. 199–212.

Ritala, et al. "Atomic Layer Epitaxy Growth of TiN Thin Films," J. Electrochem. Soc., vol. 142, No. 8, Aug. 1995.

Ritala, et al. "Atomic Layer Epitaxy Growth of TiN Thin Films From $TiI_4$ and $NH_3$," J. Electrochem. Soc., vol. 145, No. 8 (Aug. 1998) pp. 2914–2920.

Ritala, et al. "Atomic Force Microscopy Study of Titanium Dioxide Thin Films Grown by Atomic Layer Epitaxy," Thin Solid Films, vol. 228, No. 1–2 (May 15, 1993), pp. 32–35.

Proceedings of the ICEEE 1998 International Interconnect Technology Conference—San Francisco, California, Jun. 1–3, 1998.

Niinisto, et al. "Synthesis of Oxide Thin Films and Overlayers by Atomic Layer Epitaxy for Advanced Applications," Materials Science and Engineering B41 (1996) 23–29.

Min, et al. "Metal–organic Atomic–layer Deposition of Titanium–silicon–nitride films," Applied Physics Letters, vol. 75, No. 11 (Sep. 13, 1999).

Min, et al. "Chemical Vapor Deposition of Ti–Si–N Films With Alternating Source Supply," Mat. Rec. Soc. Symp. Proc. vol. (1999).

Min, et al. "Atomic Layer Deposition of TiN Thin Films by Sequential Introduction of Ti Precursor and NH3," Mat. Res. Soc. Symp. Proc. vol. 514 (1998).

Martensson, et al. "Use of Atomic Layer Epitaxy for Fabrication of Si/TiN/Cu Structures," J. Vac. Sci. & Tech. B, vol. 17, No. 5, (Sep. 1999) pp. 2122–2128.

Kukli, et al., "Tailoring the Dielectric Properties of $HfO_2$–$Ta_2$–$O_5$ Nanolaminates," Applied Physics Letters, vol. 68, No. 26, Jun. 24, 1996; p. 3737–9.

Kukli, et al., "Properties of $Ta_2O_5$–Based Dielectric nanolaminates Deposited by Atomic Layer Epitaxy," Journal of the Electrochemical Society, vol. 144, No. 1, Jan. 1997; p. 300–6.

Kukli, et al., "Properties of {$Nb_{1-x}Ta_x$}$_2O_5$ Solid Solutions and {$Nb_{1-x}Ta_x$}$_2O_5$–$ZrO_2$ Nanolaminates Grown by Atomic Layer Epitaxy," 1997; p. 785–93.

Kukli, et al., "In situ Study of Atomic Layer Epitaxy Growth of Tantalum Oxide Thin Films From Ta(OC$_2$H$_5$)$_5$ and H$_2$O," Applied Surface Science, vol. 112, Mar. 1997, p. 236–242.

Kukli, et al. "Atomic Layer Epitaxy Growth of Tantalum Oxide Thin Films from Ta(OC$_2$H$_5$)$_5$ and H$_2$O," Journal of the Electrochemical Society, vol. 142, No. 5, May 1995; p. 1670–5.

Klaus, et al. "Atomically Controlled Growth of Tungsten and Tungsten Nitride Using Sequential Surface Reactions," Applied Surface Science, 162–163 (2000) 479–491.

Hwang, et al. "Nanometer–Size α–PbO$_2$–type TiO$_2$ in Garnet: A Thermobarometer for Ultrahigh–Pressure Metamorphism," Science Vo. 288 (Apr. 14, 2000).

George, et al. "Surface Chemistry for Atomic Layer Growth," J. Phys. Chem. 1996, 100, 13121–13131.

Eisenbraum, et al. "Atomic Layer Deposition (ALD) of Tantalum–based materials for zero thickness copper barrier applications," Proceedings of the IEEE 2001 International Interconnect Technology Conference (Cat. No. 01EX461) 2001.

Klaus, et al. "Atomic Layer Deposition of SiO$_2$ Using Catalyzed and Uncatalyzed Self–Limiting Surface Reactions," Surface Review and Letters, vol. 6, Nos. 3 & 4 (1999) 435–448.

Clark–Phelps, et al. "Engineered Tantalum Aluminate and Hafnium Aluminate ALD Films for Ultrathin Dielectric Films with Improved Electrical and Thermal Properties," Mat. Res. Soc. Symp. Proc. vol. 670 (2001).

Hultman, et al. "Review of the Thermal and Mechanical Stability of TiN–based Thin Films," Z. Metallkd. 90 (1999) pp. 803.

Yamaguchi, et al. "Atomic–layer Chemical–vapor–deposition of silicon dioxide films with an extremely low hydrogen content," Applied Surface Science, 130–132 (1998) 202–207.

George, et al. "Atomic layer controlled deposition of SiO$_2$ and Al$_2$O$_3$ using ABAB . . . binary reaction sequence chemistry," Applied Surface Science 82/83 (1994) 460–467.

Wise, et al. "Diethyldiethoxysilane as a new precursor for SiO$_2$ Growth on silicon," Mat. Res. Soc. Symp. Proc. vol. 334 (1994).

Martensson, et al. "Atomic Layer Epitaxy of Copper on Tantalum," Chem. Vap. Deposition (1997) 3, No. 1.

Elers, et al. "NbCl$_5$ as a precursor in atomic layer epitaxy," Applied surface Science 82/83 (1994) 468–474.

Martensson, et al. "Atomic Layer Epitaxy of Copper," J. Electrochem. Soc., vol. 145, No. 8 (1998).

Bedair, "Atomic layer epitaxy deposition process," J. Vac. Sci. Technol. B., vol. 12, No. 1 (1994).

Yamaga, et al. "Atomic layer epitaxy of ZnS by a new gas supplying system in low–pressure metalorganic vapor phase epitaxy," J. of Crystal Growth 117 (1992).

Ohba, et al. "Thermal Deposition of Methylhydrazine and Deposition Properties of CVD TiN Thin Films," Conference Proceeding (1994) Mat. Res. Soc.

Scheper, et al. "Low–temperature deposition of titanium nitride films from dialkylhydrazine–based precursors," Materials Science in Semiconductor Processing 2 (1999) 149–157.

Suzuki, et al. "A 0.2 $\mu$m contact filling by 450$^c$–hydrazine–reduced TiN film with low resistivity".

IBM Technical Disclosure, "Knowledge–Based Dynamic Scheduler in Distributed Computer Control," Jun. 1990.

IBM Technical Disclosure, "Multiprocessor and Multitasking Architecture for Tool Cotrol of the Advanced via Inspection Tools," Mau 1992.

Solanki, et al. "Atomic Layer Deposition of Copper Seed Layers," Electrochemical and Solid State Letters, vol. 3, No. 10 (2000).

Rossnagel, et al. "Plasma–enhanced atomic layer deposition of Ta and Ti for interconnect diffusion barriers," J. Vac. Sci. Technol. B, vol. 18, No. 4 (2000).

McGeachin, "Synthesis and properties of some β–diketimines derived from acetylacetone, and their metal complexes," Canadian J. of Chemistry, vol. 46, 1968.

Choi, et al. "The effect of annealing on resistivity of low pressure chemical vapor deposited titanium diboride," J. Appl. Phys, vol. 69, No. 11 (1991).

Choi, et al. "Stability of TiB$_2$ as a diffusion barrier on silicon," J. Electrochem. Soc., vol. 138, No. 10 (1991).

Maydan, "Cluster tools for Fabrication of Advanced Devices," Extended Abstracts of the 22$^{nd}$ (1990 International) Conference on Solid State Devices and Materials, Sendai, 1990, pp. 849–852.

Derbyshire, "Applications of integrated processing" Solid State Technology, Dec., 1994.

Kitagawa, et al. "Hydrogen–mediated low–temperature epitaxyof Si in plasma–enhanced chemical vapor deposition," Applied Surface Science 159–160 (2000) 30–34.

Lee, et al. "Pulsed nucleation for ultra–high aspect ration of tungsten plugfill," Advanced Metallization Conference (2001), pp. 649–654.

* cited by examiner

APPARATUS AND METHOD FOR PLASMA ASSISTED DEPOSITION

CROSS-REFERENCE TO RELATED APPLICATIONS

This application claims benefit of U.S. provisional patent application Ser. No. 60/352,191, filed Jan. 26, 2002, which is herein incorporated by reference.

BACKGROUND OF THE INVENTION

1. Field of the Invention

Embodiments of the present invention generally relate to an apparatus and method for plasma assisted deposition. More particularly, embodiments of the present invention relate to an apparatus and method of plasma assisted deposition by generation of a plasma adjacent a processing region.

2. Description of the Related Art

Reliably producing sub-micron and smaller features is one of the key technologies for the next generation of very large scale integration (VLSI) and ultra large scale integration (ULSI) of semiconductor devices. However, as the fringes of circuit technology are pressed, the shrinking dimensions of interconnects in VLSI and ULSI technology have placed additional demands on the processing capabilities. The multilevel interconnects that lie at the heart of this technology require precise processing of high aspect ratio features, such as vias and other interconnects. Reliable formation of these interconnects is very important to VLSI and ULSI success and to the continued effort to increase circuit density and quality of individual substrates.

As circuit densities increase, the widths of vias, contacts and other features, as well as the dielectric materials between them, decrease to sub-micron dimensions (e.g., less than 0.20 micrometers or less), whereas the thickness of the dielectric layers remains substantially constant, with the result that the aspect ratios for the features, i.e., their height divided by width, increases. Many traditional deposition processes have difficulty filling sub-micron structures. Therefore, there is a great amount of ongoing effort being directed at the formation of substantially void-free and seam-free sub-micron features having high aspect ratios.

Atomic layer deposition is one deposition technique being explored for the deposition of material layers over features having high aspect ratios. One example of atomic layer deposition comprises the sequential introduction of pulses of gases. For instance, one cycle for the sequential introduction of pulses of gases may comprise a pulse of a first reactant gas, followed by a pulse of a purge gas and/or a pump evacuation, followed by a pulse of a second reactant gas, and followed by a pulse of a purge gas and/or a pump evacuation. Sequential introduction of separate pulses of the first reactant and the second reactant is intended to result in the alternating self-limiting adsorption of monolayers of the reactants on the surface of the substrate and, thus, forms a monolayer of material for each cycle. The cycle is repeated to a desired thickness of the deposited material. A pulse of a purge gas and/or a pump evacuation between the pulses of the first reactant gas and the pulses of the second reactant gas is intended to promote reaction of the first reactant gas and the second reactant gas at the surface of a substrate by limiting gas phase reactions.

FIG. 1 is a schematic cross-sectional view of a prior art chamber 10 adapted for chemical vapor deposition. The chamber 10 includes a showerhead 40 and a substrate support 32 for supporting a substrate 36. The showerhead 40 has a central gas inlet 44 for the injection of gases and has a plurality of holes 42 to accommodate the flow of gases therethrough. A power source 70, such as an RF power source, is coupled to the showerhead 40 to create an electric field between the shower head 40 and the substrate support 32 generating a plasma 80 therebetween. One problem with the use of prior chambers, such as chamber 10, for atomic layer deposition requiring a plasma 80 is that the plasma 80 may etch or remove deposited materials on the surface of the substrate 36 due to the ion bombardment or sputtering by the plasma 80 of the deposited material on the substrate 36 which is particularly detrimental in atomic layer deposition in which a monolayer of material is desired to be deposited per cycle of gases.

Prior attempts to perform atomic layer deposition also include generating a plasma through a remote plasma source separate from the processing chamber and directing the atomic species into the processing chamber for reaction. One problem associated with these prior attempts is that the atomic species may easily recombine preventing the reaction of the atomic species on the surface of the substrate.

Thus, there is a need for an improved apparatus and method of generating a plasma in deposition processes.

SUMMARY OF THE INVENTION

Embodiments of the present invention generally relate to an apparatus and method for plasma assisted deposition. More particularly, embodiments of the present invention relate to an apparatus and method of plasma assisted deposition by generation of a plasma adjacent a processing region. One embodiment of the apparatus comprises a substrate processing chamber including a top shower plate, a power source coupled to the top shower plate, a bottom shower plate, and an insulator disposed between the top shower plate and the bottom shower plate. In one aspect, the power source is adapted to selectively provide power to the top shower plate to generate a plasma from the gases between the top shower plate and the bottom shower plate. In another embodiment, a power source is coupled to the top shower plate and the bottom shower plate to generate a plasma between the bottom shower plate and the substrate support. In still another embodiment, a power source is coupled to the top shower plate and to the bottom shower plate to selectively provide power to the top shower plate or to the top and bottom shower plate to selectively generate a plasma from the gases between the top shower plate and the bottom shower plate or from the gases between the bottom shower plate and the substrate support.

One embodiment of the method comprises performing in a single chamber one or more of the processes including, but not limited to, cyclical layer deposition, combined cyclical layer deposition and plasma-enhanced chemical vapor deposition; plasma-enhanced chemical vapor deposition; and/or chemical vapor deposition.

BRIEF DESCRIPTION OF THE DRAWINGS

So that the manner in which the features of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Process Chambers

Figure 1:
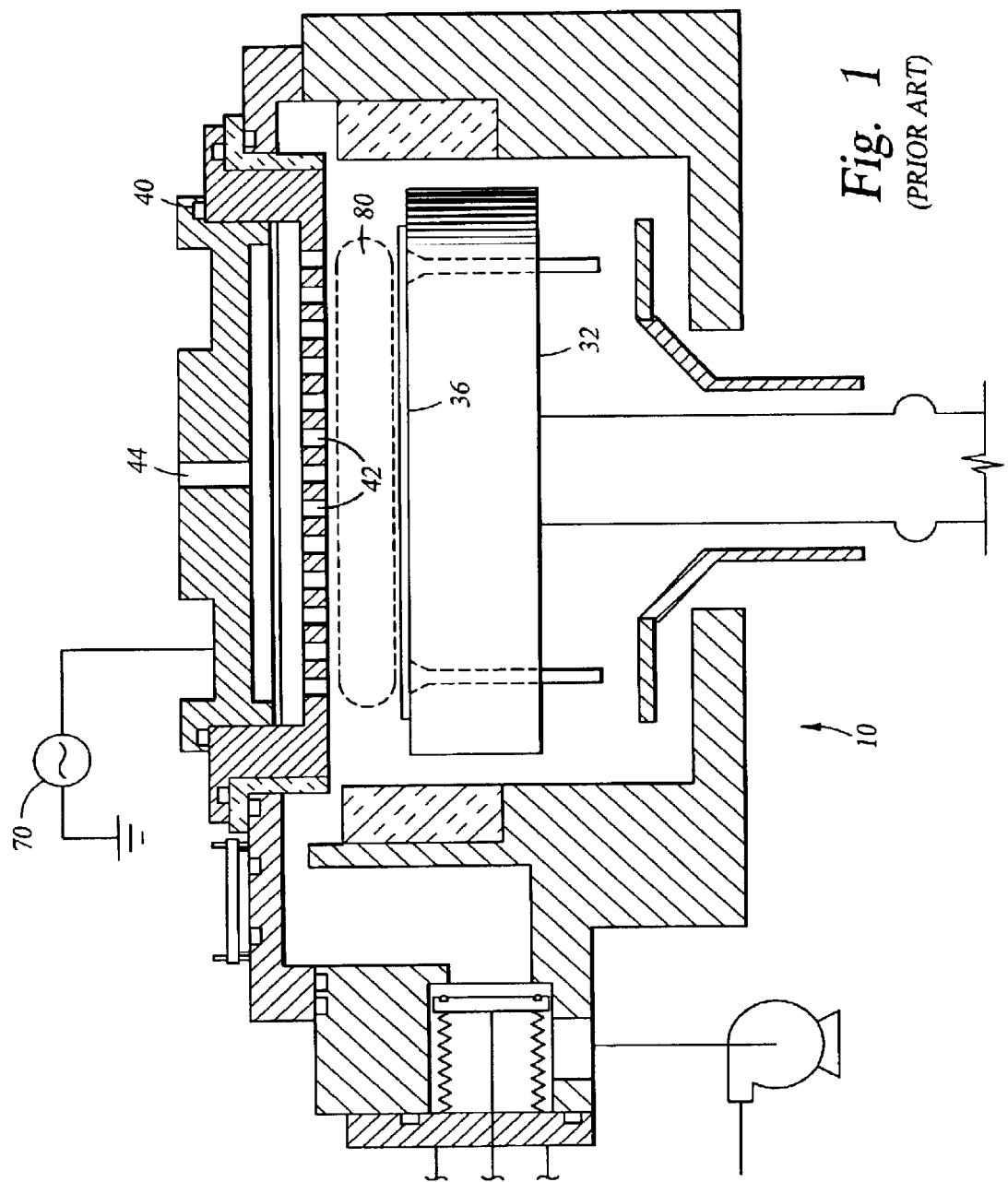
FIG. 1 is a schematic cross-sectional view of a prior art chamber adapted for plasma deposition.
Figure 2:
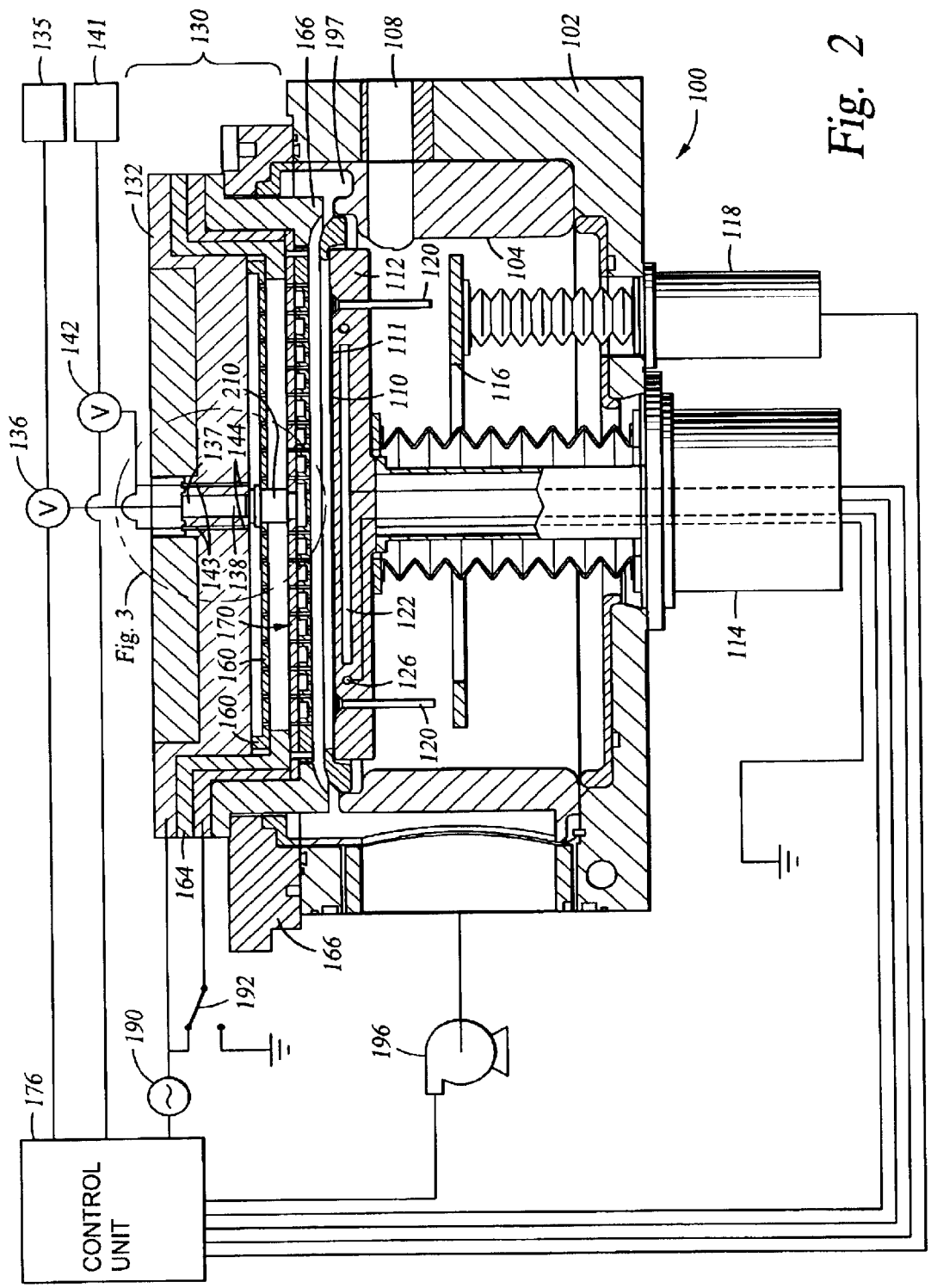
FIG. 2 is a schematic cross-sectional view of one embodiment of a chamber adapted to generate a plasma within the gas distribution system of the processing chamber.

FIG. 2 is a schematic cross-sectional view of one embodiment of a chamber 100 adapted to generate a plasma within the gas distribution system of the processing chamber. The chamber 100 comprises a chamber body 102 having a liner 104 disposed therein. An opening 108 in the chamber 100 provides access for a robot (not shown) to deliver and retrieve substrates 110, such as, for example, 200 mm semiconductor wafer, 300 mm semiconductor wafers or glass substrates, to the chamber 100.

A substrate support 112 supports the substrate 110 on a substrate receiving surface 111 in the chamber 100. The substrate support 112 is mounted to a lift motor 114 to raise and lower the substrate support 112 and a substrate 110 disposed thereon. A lift plate 116 connected to a lift motor 118 is mounted in the chamber and raises and lowers pins 120 movably disposed through the substrate support 112. The pins 120 raise and lower the substrate 110 over the surface of the substrate support 112.

The substrate support 112 may be heated to heat the substrate 110 disposed thereon. For example, the substrate support 112 may have an embedded heating element 122 to resistively heat the substrate support 112 by applying an electric current from a power supply (not shown). A temperature sensor 126, such as a thermocouple, may be embedded in the substrate support 112 to monitor the temperature of the substrate support 112. For example, a measured temperature may be used in a feedback loop to control electric current applied to the heating element 122 from a power supply (not shown), such that the substrate temperature can be maintained or controlled at a desired temperature or within a desired temperature range. Alternatively, the substrate 110 may be heated using radiant heat, such as by lamps.

A gas distribution system 130 is disposed at an upper portion of the chamber body 102 to provide a gas, such as a process gas and/or a purge gas, to the chamber 100. The gas distribution system 130 may act as a chamber lid of the chamber body 102. The gas distribution system 130 comprises a gas box 132, a top shower plate 160 positioned below the gas box 132, and a bottom shower plate 170 positioned below the top shower plate 160. The gas distribution system 130 is adapted to provide gas flows to the substrate receiving surface 111.

The top shower plate 160 is separated from the bottom shower plate 170 by an insulator 164 to electrically insulate the top shower plate 160 from the bottom shower plate 170. The insulator 164 is made of an insulating material, such as quartz, Teflon™, Vespel™, ceramics, other polymers, and other materials. The bottom shower plate 170 may be disposed on an upper portion of the chamber body 102, such as on a lid rim 166 disposed on the chamber body 102. In one embodiment, the lid rim 166 comprises an insulating material to electrically insulate the bottom shower plate 170 from the chamber body 102.

Figure 3:
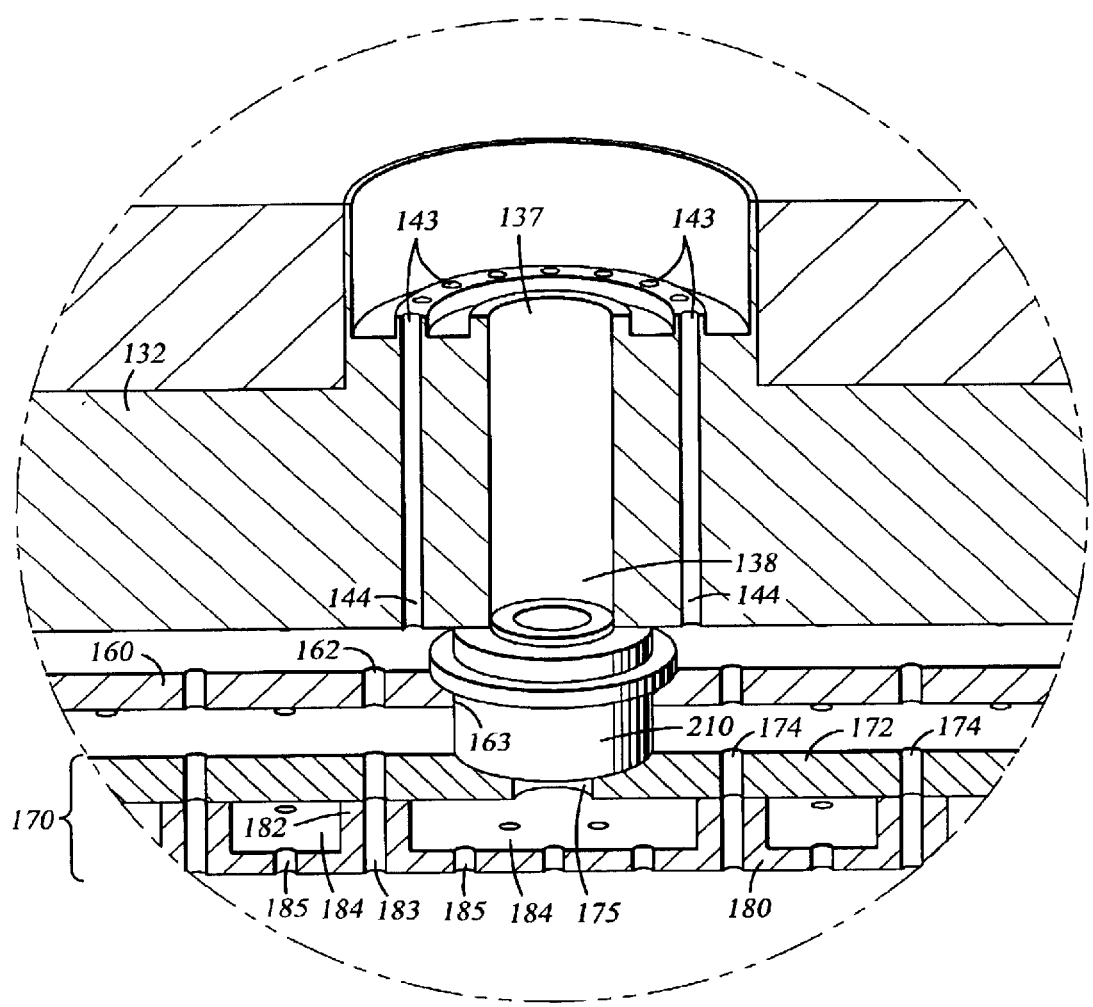
FIG. 3 is a schematic partial cross-sectional view of a portion of the gas box, a portion of the top shower plate, and a portion of the bottom shower plate of FIG. 2.

FIG. 3 is a schematic partial cross-sectional view of a portion of the gas box 132, a portion of the top shower plate 160, and a portion of the bottom shower plate 170 of FIG. 2. In reference to FIG. 2 and FIG. 3, the gas box 132 comprises a central gas channel 137 and a plurality of outer gas channels 143. The central gas channel 137 provides one discrete path for the flow of one or more gases through the gas box 132 while the outer channels 143 provides another discrete path for the flow of one or more gases through the gas box 132. The central gas channel 137 is coupled to a first gas source 135 (FIG. 2) through valve 136 (FIG. 2). The central gas channel 137 has a first gas outlet 138 and is adapted to deliver a first gas from the first gas source 135 to a gas conduit 210. The term "gas" as used herein is intended to mean a single gas or a gas mixture. The outer gas channels 143 are coupled to a second gas source 141 (FIG. 2) through valve 142 (FIG. 2). The outer gas channels 143 have second gas outlets 144 and are adapted to deliver a second gas from the second gas source 141 to the top shower plate 160. Preferably, the second gas outlets 144 of the outer gas channels 143 are adapted to deliver the second gas proximate a central portion of the top shower plate. Gas sources 135, 141 may be adapted to store a gas or liquid precursor in a cooled, heated, or ambient environment. The valves 136, 142 control delivery of the first gas and the second gas into the central gas channel 137 and the outer gas channels 143 respectively and may be electrically controlled valves, pneumatically controlled valves, piezoelectric valves, or other suitable valves. In another embodiment, the outer gas channels 143 may comprise a plurality of discrete flow paths for the flow of a plurality of gases through the gas box 132 by separately coupling separate gas sources to a particular outer gas channel.

The gas box 132 may further comprise a cooling/heating channel to control the temperature of the gas distribution system 130 by providing a cooling fluid or a heating fluid to the gas box 132 depending on the particular process being performed in the chamber 100.

Referring to FIG. 3, the top shower plate 160 has a plurality of holes 162 to accommodate a gas flow therethrough from the outer gas channels 143 of the gas box 132 to the bottom shower plate 170. The gas conduit 210 is disposed through an aperture 163 in the top shower plate 160 and is disposed on the bottom shower plate 170. The gas conduit 210 is preferably made of an insulating material, such as quartz, Teflon™, Vespel™, ceramics, other polymers, and other materials, to prevent electrical coupling of the top shower plate 160 and the bottom shower plate 170.

The bottom shower plate 170 comprises a first piece 172 connected to a second piece 180. The first piece 172 has a plurality of holes 174 to provide a flow of a gas therethrough. The second piece 180 comprises a plurality of columns 182 having column holes 183 formed therethrough and a plurality of grooves 184 having groove holes 185 formed therethrough. The top surface of the columns 182 are connected to the bottom surface of the first piece 172 so that the column holes 183 align with the holes 174 of the first piece 172. Therefore, one discrete passageway is provided through the holes of the first piece 172 and through the column holes 183 of the columns 182 to deliver a gas flow from the top shower plate 160 to the substrate receiving surface 111. An aperture 175 is formed through the first piece 172 and aligns with the grooves on the second piece 180. Therefore, another discrete passageway is provided through the aperture 175 of the first piece 172 and through the grooves 184 and groove holes 185 of the second piece 180 to deliver a gas flow from the gas conduit 210 to the substrate receiving surface 111. In one embodiment, the first piece 172 and the second piece 180 are brazed or diffusion-bonded together to prevent leakage between the discrete passageways.

Figure 4:
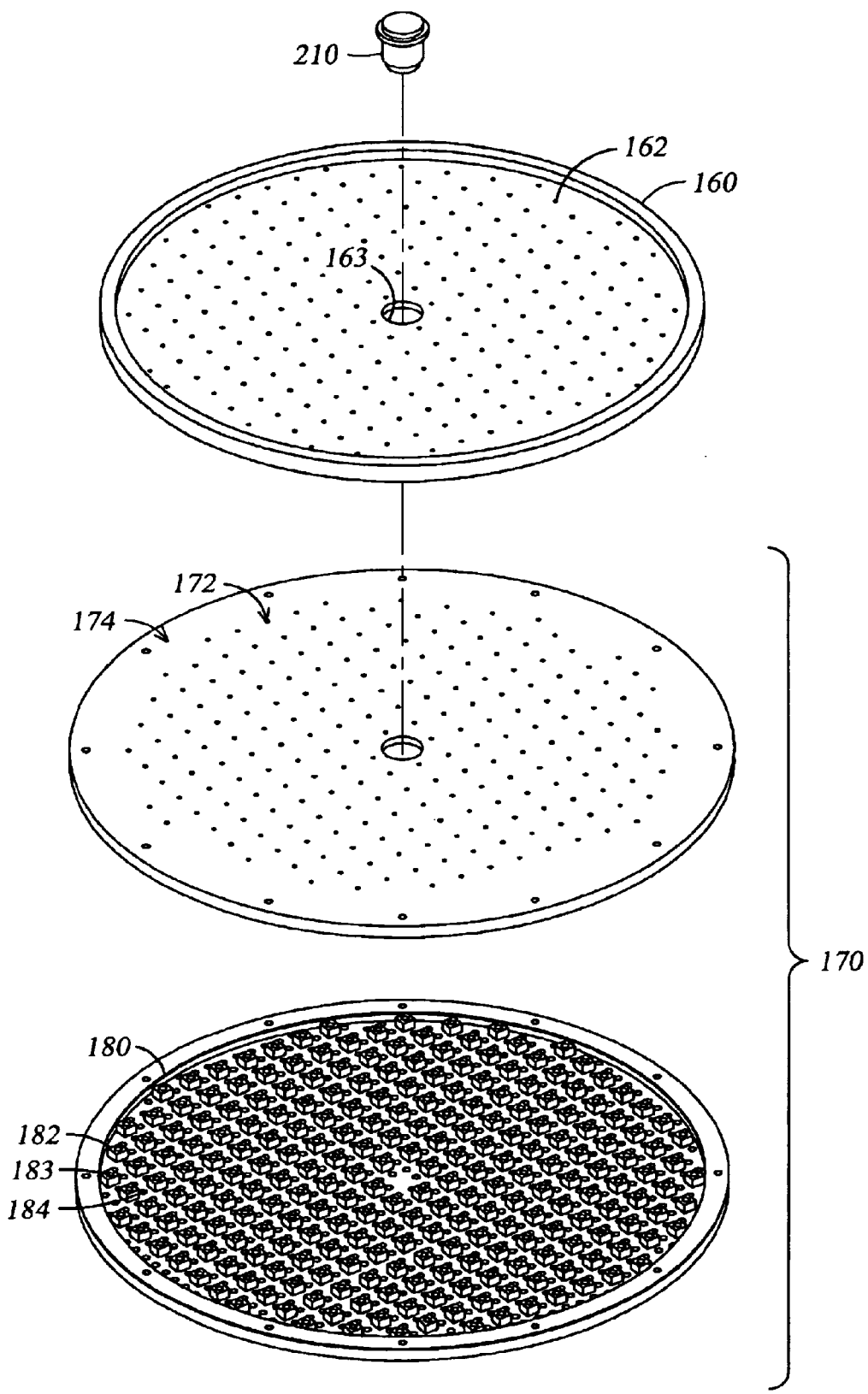
FIG. 4 is a schematic exploded perspective view of a top shower plate, a gas conduit, and a first piece and a second piece of a bottom shower plate.
Figure 5:
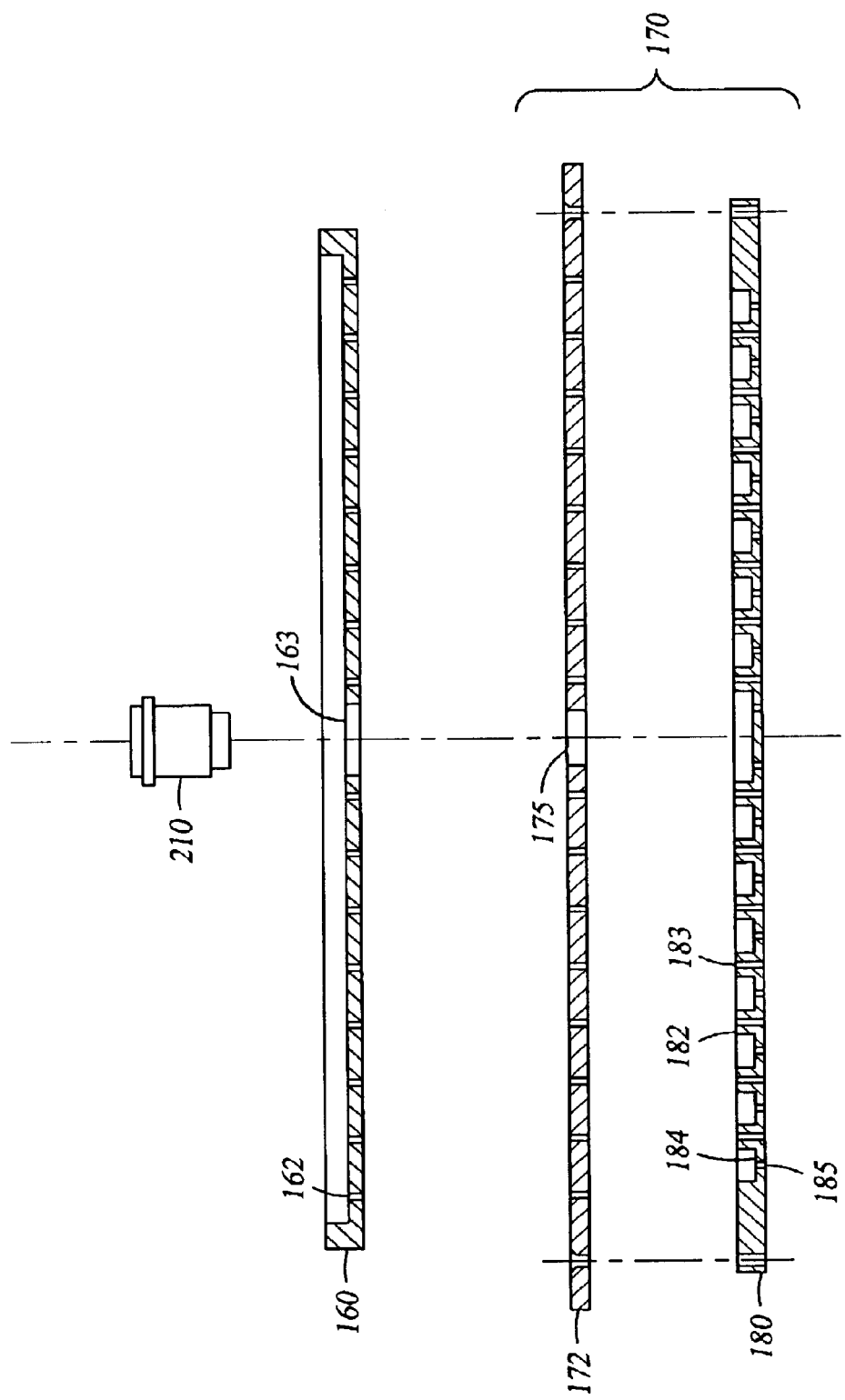
FIG. 5 is a schematic exploded cross-sectional view of a top shower plate, the gas conduit, and a first piece and a second piece of the bottom shower plate.

FIG. 4 is a schematic exploded perspective view of the gas conduit 210, the top shower plate 160, and the first piece 172 and the second piece 180 of the bottom shower plate 170. FIG. 5 is a schematic exploded cross-sectional view of the gas conduit 210, the top shower plate 160, and the first piece 172 and the second piece 180 of the bottom shower plate 170. In reference to FIG. 4 and FIG. 5, the gas conduit 210 is disposed through the aperture 163 of the top shower plate 160 and coupled to the aperture 175 of the first piece 172 of the bottom shower plate 170. Preferably, there are no columns 183 directly below the aperture 175 to allow the flow of a gas from the gas conduit 210 through the aperture 175 to the grooves 184 of bottom shower plate 170. The columns 182 and grooves 184 may be arranged so that the grooves 184 are in communication with one another. In one embodiment, the columns 182 and grooves 184 are formed by machining the grooves 184 into the second piece 180. Other embodiments of the bottom shower plate include a first piece having grooves and columns and a second piece comprising a plurality of holes.

The top shower plate 160, the bottom shower plate 170, and the gas box 132 may be made of stainless steel, aluminum, nickel-plated metal, nickel-plated aluminum, nickel, nickel alloys (such as INCONEL®, HASTELLOY®), graphite, other suitable materials, and combinations thereof. In general, the top shower plate 160 and the bottom shower plate 170 are sized and shaped substantially equal to or larger than the substrate receiving surface 111.

Referring to FIG. 2, a power source 190 may be coupled to the top shower plate 160 through the gas box 132 to provide a power electrode and the bottom shower plate 170 may be grounded to provide a ground electrode. The power source 190 may be an RF or DC power source. An electric field may be established between the top shower plate 160 and the bottom shower plate 170 to generate a plasma from the gases introduced between the top shower plate 160 and the bottom shower plate 170.

In another embodiment, the power source 190 may be coupled to the top shower plate 160 and the bottom shower plate 170. A switch device 192 is coupled between the power source 190 and the bottom shower plate 170 to selectively power or ground the bottom shower plate 170. In one aspect, power source 190 provides power to the top shower plate 160 and the bottom shower plate 170 so that the top shower plate 160 and the bottom shower plate 170 are at the same or substantially the same potential. With a grounded substrate support 112, the top shower plate 160 and the bottom shower plate 170 act as one electrode and the substrate support 112 acts as another electrode of spaced apart electrodes in which an electric field is established between the bottom shower plate 170 and the substrate support 112 to generate a plasma from the gases introduced between the bottom shower plate 170 and the substrate support 112. Therefore, the bottom shower plate 170 may be selectively powered or grounded to selectively generate a plasma between the top shower plate 160 and the bottom shower plate 170 or between the bottom shower plate 170 and the substrate support 112.

In still another embodiment, the substrate support 112 may be selectively powered or grounded in addition to the bottom shower plate 170 being selectively powered or grounded to provide a plasma between the bottom shower plate 170 and the substrate support 112.

A vacuum system 196 is in communication with a pumping channel 197 formed in the chamber body 102 to evacuate gases from the chamber 100 and to help maintain a desired pressure or a desired pressure range inside the chamber 100.

Control unit 176 may be coupled to the chamber 100 to control processing conditions. For example, the control unit 176 may be connected to the valves 136, 142 to control the flow of gases through the gas distribution system 130 during different stages of a substrate process sequence. In another example, the control unit 176 may be connected to the power source 190 to control generation of a plasma. In another example, the control unit 176 may be connected to the embedded heating element 122 to control the temperature of the substrate support 112. The control unit 176 may be configured to be responsible for automated control of other activities used in substrate processing, such as substrate transport, chamber evacuation, and other activities, some of which are described elsewhere herein.

Referring to FIG. 2 and FIG. 3, in operation, a substrate 110 is delivered to the chamber 100 through the opening 108 by a robot (not shown). The substrate 110 is positioned on the substrate support 112 through cooperation of the lift pins 120 and the robot. The substrate support 112 raises the substrate 110 into close opposition to the bottom shower plate 170. A first gas and/or a second gas is injected into the chamber 100 through the central gas channel 137 and/or the outer gas channels 143 of the gas box 132. If a first gas is injected, the first gas flows though the central gas channel 137 of the gas box 132 to the gas conduit 210, through the gas conduit 210 to the bottom shower plate 170, and through the grooves 184 and groove holes 185 of the bottom shower plate 170 to the substrate receiving surface 111. If a second gas is injected, the second gas flows through the outer gas channels 143 of the gas box 132 to the top shower plate 160, through the holes 162 of the top shower plate 160 to the bottom shower plate 170, and through the column holes 183 of the bottom shower plate 170 to the substrate receiving surface 111. Excess gas, by-products, etc. flow into the pumping channel 197 and are then exhausted from the chamber by a vacuum system 196. Since the first gas and the second gas flow through the gas distribution system 130 from a central portion of the gas box 132 outward to a peripheral region of the bottom shower plate 170, purging of the gases from the gas distribution system 130 is faster than other dual gas delivery showerheads in which one or more gas flows are delivered from a perimeter portion of the showerhead to a central portion of the showerhead.

In one aspect, an electric field may be established between the top shower plate 160 and the bottom shower plate 170 to generate a plasma from a gas between the top shower plate 160 and the bottom shower plate 170. Atomic species may flow through the column holes 183 of the bottom shower plate 170 to the substrate receiving surface 111. In another aspect, an electric field may be created between the bottom shower plate 170 and the substrate support 112 to generate a plasma from a gas between the bottom shower plate 170 and the substrate support 112.

In one aspect, generating a plasma between the top shower plate 160 and the bottom shower plate 170 may be used to advantage in cyclical layer deposition. The term "cyclical layer deposition" as used herein refers to the sequential introduction of one or more compounds to deposit a thin layer of material over a structure and includes processing techniques. Compounds can be reactants, reductants, precursors, catalysts, plasma species, and mixtures thereof. Sequentially providing compounds may result in the formation of thin layers of material over a substrate structure. Each thin layer of material may be less than a monolayer, a monolayer, or more than a monolayer of material. The sequential introduction of compounds may be repeated to deposit a plurality of thin layers forming a conformal film to a desired thickness. Since a plasma is not generated between a showerhead and the substrate support, there is less of an etching effect or removal effect of the plasma on deposited materials on the substrate 110 due to ion bombardment or sputtering by the plasma. In addition, the gas distribution system 130 may be used to advantage in cyclical layer deposition because the first gas and the second gas may be separately delivered through the gas distribution system 130. Thus, gas phase reactions between the first gas and the second gas may be reduced and prevented in components of the gas distribution system 130. In one aspect, because a plasma is generated between the top shower plate 160 and the bottom shower plate 170 (as opposed to a remote plasma source), a smaller amount of atomic species recombine to gas compounds (i.e., atomic hydrogen species recombining into hydrogen gas). Atomic species travel a shorter distance from the bottom shower plate 170 to the substrate receiving surface 111 in comparison to the distance atomic species must travel from a remote plasma source to the substrate receiving surface 111. Because of a reduction of the "recombination effect," a greater amount of atomic species for a particular process, such as hydrogen species, are directed to the substrate receiving surface 111 increasing the throughput of a deposition process, such as a cyclical layer deposition process.

In reference to FIG. 3, in one specific embodiment, the column holes 183 of the bottom shower plate 170 have a diameter less than about 100 mils. If the column holes 183 of the bottom shower plate 170 are too large, then the plasma will still have an ion bombardment/sputter effect on deposited materials. If the column holes 183 are too small, then there will still be a recombination effect of atomic species recombining to gas compounds due to gas phase recombination and surface recombination on the surfaces of the bottom shower plate 170. In one specific embodiment, the distance between the top shower plate 160 and the bottom shower plate 170 is between about 100 mils and about 800 mils. If the distance between the top shower plate 160 and bottom shower plate 170 is too short, arcing may occur. In one specific embodiment, the distance between the bottom shower plate 170 and the substrate support 112 during one technique of substrate processing (i.e. cyclical layer deposition) is between about 100 mils and about 1,000 mils.

In reference to FIG. 2, in one aspect, generating a plasma between the bottom shower plate 170 and the substrate support 112 may be used to advantage in chemical vapor deposition processes. The bottom shower plate 170 provides two separate uniform gas flows to the substrate receiving surface 111. Since chemical vapor deposition processes occur in more of a gas phase and/or thermal decomposition process rather than an adsorption process, the etching effect of the plasma generated in this region is not as detrimental to film deposition as in cyclical layer deposition. In addition, the bottom shower plate 170 provides a uniform mixture of the first gas and the second gas between the bottom shower plate 170 and the substrate support 112 which may be beneficial in providing a uniform plasma for chemical vapor deposition.

Other embodiments of chamber 100 are also within the scope of the present disclosure. For example, the bottom shower plate may comprise other dual gas delivery shower plates. For instance, a dual gas delivery shower plate may be adapted to receive a gas at a peripheral portion of the shower plate, such as the shower plate disclosed in U.S. Pat. No. 6,086,677, to Umotoy et al. entitled "Dual Gas Faceplate for a Showerhead in a Semiconductor Processing System," disclosed is U.S. Pat. No. 6,302,964, to Umotoy et al. entitled "One-Piece Dual Gas Faceplate for a Showerhead in a Semiconductor Wafer Processing System", or disclosed in U.S. patent application Ser. No. 10/033,544, to Hytros et al. entitled "Dual-Gas Delivery System for Chemical Vapor Deposition Processes, which are all incorporated by reference in their entirety to the extent not inconsistent with the present disclosure. Another example of a dual gas delivery shower plate is disclosed in U.S. Pat. No. 6,148,761, to Majewski et al. entitled "Dual Channel Gas Distribution Plate." In other embodiments, the chamber 100 may comprise a bottom shower plate with only a single gas channel (i.e. a plate having a plurality of holes formed therethrough).

Deposition Processes

Chamber 100 as described in FIGS. 2–5 may be used to implement the following exemplary process for deposition of titanium (Ti), titanium nitride (TiN), tantalum (Ta), tantalum nitride, tungsten (W), tungsten nitride (WN), other refractory metals, other refractory metal nitrides, other refractory metal compounds, other materials, and combinations thereof. Chamber 100 may also be used to implement other processes. For example, chamber 100 may be used to advantage in the deposition of dielectric materials, such as titanium oxide and titanium carbide. In addition, chamber 100 may be used to advantage in the deposition of low-k materials utilizing an oxygen plasma. It should also be understood that the following processes may be performed in other chambers as well.

A. Cyclical Layer Deposition of a Refractory Metal Layer

Chamber 100 may be used to deposit a refractory metal layer by cyclical layer deposition. In one embodiment, cyclical layer deposition of a refractory metal layer comprises sequentially providing a refractory metal containing compound and a hydrogen plasma in process chamber 100. Sequentially providing a refractory metal containing compound and a hydrogen plasma may result in the alternating adsorption of a refractory metal containing compound and reduction of the refractory metal containing compound by atomic hydrogen to form thin layers of a refractory metal on a substrate structure. The terms "adsorption" or "adsorb" as used herein are defined to include chemisorption, physisorption, or any attractive and/or bonding forces which may be at work and/or which may contribute to the bonding, reaction, adherence, or occupation of a portion of an exposed surface of a substrate structure. In certain aspects, embodiments of cyclical layer deposition provide improved conformal coverage over substrate structures in comparison to conventional chemical vapor deposition. In addition, in certain aspects, embodiments of cyclical layer deposition provide a deposited layer with less incorporated impurities.

For clarity reasons, deposition of a refractory metal layer will be described in more detail in reference to one embodiment of a refractory metal layer comprising a titanium layer. Deposition of a tantalum layer or tungsten layer would follow similar processes.

Figure 6:
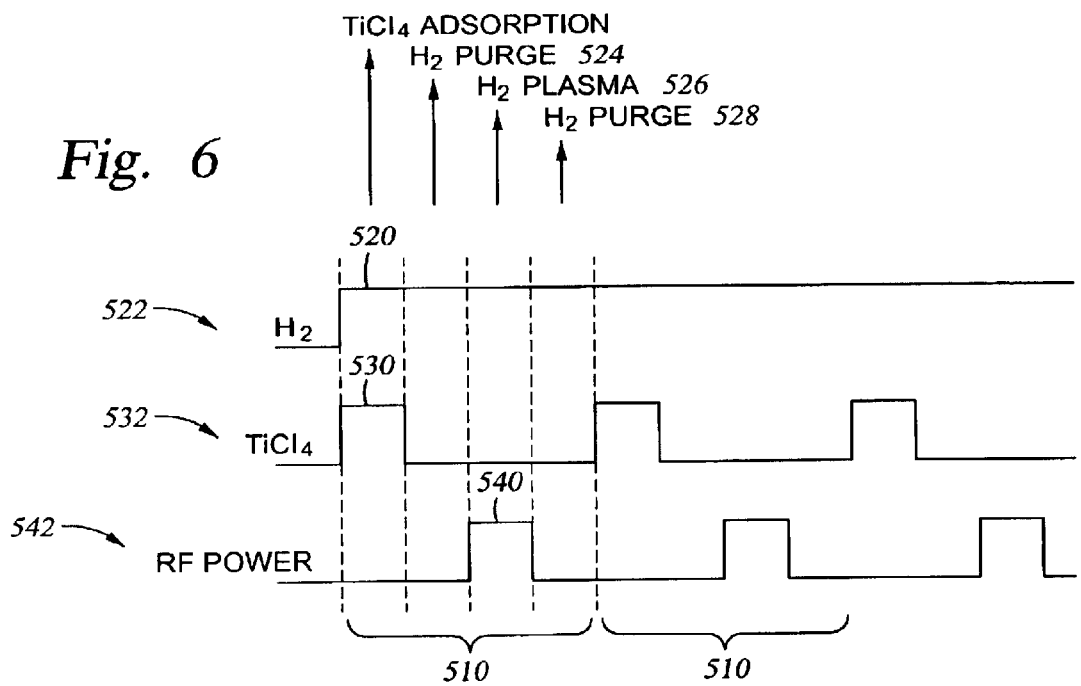
FIG. 6 is a graph of an exemplary process illustrating the control signals for sequentially providing a titanium containing compound and a hydrogen plasma.

FIG. 6 is a graph of an exemplary process illustrating the control signals for sequentially providing a titanium containing compound and a hydrogen plasma in process chamber 100 (FIG. 2) to deposit a titanium layer. One cycle 510 of sequentially providing a titanium containing compound and a hydrogen plasma to process chamber 100 (FIG. 2) comprises providing a continuous flow 520 of a hydrogen containing gas 522, such as hydrogen gas ($H_2$), to the chamber through the outer gas channels 143 (FIG. 2), through the top shower plate 160 (FIG. 3), and through the column holes 183 of the bottom shower plate 170 (FIG. 3) to the substrate receiving surface 111 (FIG. 2). During the continuous flow 520 of the hydrogen containing gas 522, a pulse 530 of a titanium containing compound 532, such as $TiCl_4$, is introduced to the chamber through the central gas channel 137 (FIG. 2) of the gas distribution system 130, through the gas conduit 210 (FIG. 3), and through the groove holes 185 of the bottom shower plate 170 (FIG. 3) to the substrate receiving surface 111 (FIG. 2). The titanium containing compound 532 may be introduced alone or with the aid of a carrier gas, such as argon gas, helium gas, hydrogen gas, or combinations thereof. If a carrier gas is used, the carrier gas may also be pulsed into the chamber 100 (FIG. 2) or the carrier gas may be a continuous flow in which the titanium containing compound 532 is dosed into the stream of the carrier gas. Preferably, a continuous flow of a carrier gas is used. After the pulse 530 of the titanium containing compound 532, the flow 520 of the hydrogen containing gas 522 continues to the chamber to act as a purge gas 524 to reduce gas phase reactions (i.e. between the titanium containing compound 532 and the hydrogen plasma 526 introduced thereafter). Then during the continuous flow 520 of the hydrogen containing gas 522, a pulse 540 of plasma power 542, such as an RF power, is provided to the top shower plate 160 (FIG. 2) to generate a hydrogen plasma 526 from the flow 520 of the hydrogen containing gas 522 between the top shower plate 160 and the bottom shower plate 170 (FIG. 2). The generated atomic hydrogen flows through the column holes 183 of the bottom shower plate 170 (FIG. 3) to the substrate receiving surface 111 (FIG. 2). After the pulse 540 of plasma power 542, the flow 520 of the hydrogen containing gas 522 continues to the chamber to act as a purge gas 528 to reduce gas phase reactions between the titanium containing compound 532 and the hydrogen plasma 526. The cycle 510 may be repeated to a desired thickness of the titanium layer.

In general, hydrogen gas does not substantially react with titanium precursors, such as $TiCl_4$, even at high heater temperatures. Therefore, a hydrogen plasma (i.e., atomic hydrogen) is necessary for the reaction of a titanium containing compound to deposit titanium. In one aspect, the continuous flow 520 of the hydrogen containing gas 522 allows for the gas delivery system and associated valve design to be simpler and more efficient since valves, such as valve 142, do not need to be constantly turned on and off to pulse the hydrogen containing gas into the chamber.

In another embodiment, the above method may be performed in chamber 100 (FIG. 2) with a gas conduit, similar to the gas conduit as shown in FIG. 3, which only extends between the central gas channel 137 and through the aperture 163 of the top shower 160 plate. As a consequence, the titanium containing compound 532 flows between the top shower plate 160 and the bottom shower plate 170 and through the column holes of the bottom shower plate 170. Since a hydrogen plasma 526 and a titanium containing compound 532 are introduced at different times between the top shower plate 160 and the bottom shower plate 170, gas phase reactions between the hydrogen plasma 526 and the titanium containing compound 532 are minimal.

Not wishing to be bound by theory, it is believed that reaction of the titanium containing compound 532 and the hydrogen plasma 526 is self-limiting in that only one monolayer or less of the titanium containing compound 532 may be adsorbed onto the substrate surface to form one monolayer or less of titanium due to the purge gas separating the pulses of the titanium containing compound 532 and pulses of the hydrogen plasma 526. In other embodiments, the sequence of gas delivery may be varied to provide a partial self-limiting deposition process or a non-self-limiting deposition process. For example, the pulse 530 of the titanium containing compound 532 may be partially overlapped with the pulse 540 of plasma power 542 to provide a combined mode of deposition (i.e. a combined adsorption process and gas-phase/thermal co-reaction process between the titanium containing compound and the hydrogen plasma). In another example, the purge gas 524, 528 may only partially separate the pulses of the titanium containing compound 532 and the pulses of the hydrogen plasma 526.

It is understood that the titanium containing compound 532 may also be other titanium based precursors such as titanium iodide ($TiI_4$), titanium bromide ($TiBr_4$), or other titanium halides. The titanium containing compound 532 may also be a metal organic compound such as, for example, tetrakis(dimethylamino)titanium (TDMAT), tetrakis(diethylamino)titanium (TDEAT), among others. The hydrogen containing gas 522 may also be other reducing gases, such as silane ($SiH_4$), borane ($BH_3$), diborane ($B_2H_6$), triborane ($B_3H_9$), among others.

One exemplary process of depositing a titanium layer by cyclical layer deposition in process chamber 100, as described in FIGS. 2–5, comprises providing a titanium containing compound comprising titanium tetrachloride ($TiCl_4$) for a time period between about 0.1 to about 5.0 seconds, preferably less than about 1 second, to the central gas channel 137 (FIG. 2). Because the titanium containing compound is provided as a pulse it is difficult to determine the corresponding flow rate that the titanium containing compound is provided. However, it is believed that the titanium tetrachloride is provided at a total flow rate between about 5 mg/m to about 500 mg/m. The titanium tetrachloride is provided with a carrier gas, such as hydrogen gas, helium gas, argon gas, and combinations thereof, at a flow rate between about 500 sccm and about 10,000 sccm. A hydrogen containing gas comprising hydrogen gas ($H_2$) with a carrier gas, such as helium, argon, or combinations thereof, is provided at a continuous flow at a total flow rate between about 100 sccm and about 5,000 sccm to the outer gas channels 143 (FIG. 2). The plasma power is provided for a time period between about 0.1 seconds and about 5.0 seconds, preferably less than about 1 second. The plasma power is preferably a RF power between about 50 W and about 2,000 W, preferably between 300 W to about 1000 W, at a frequency of 13.56 MHz. The heater temperature preferably is maintained at a temperature range between about 20° C. and about 700° C., preferably between about 250° C. and about 500° C. In one aspect, it is believed that flowing in titanium tetrachloride at a heater temperature less than about 500° C. reduces the etching effect of the chlorine in the titanium tetrachloride to materials thereunder. The chamber is maintained at a chamber pressure between about 1.0 torr and about 20 torr, and preferably between about 2.0 torr and about 10.0 torr. This process provides a titanium layer in a thickness which is believed to be between about 0.2 Å and about 2.0 Å per cycle. The alternating sequence may be repeated until a desired thickness is achieved. The thickness of the titanium layer may be deposited to any thickness depending on the particular application.

For the deposition of a refractory metal layer comprising tantalum, a tantalum containing compound is used. Tantalum containing compounds include tantalum based precursors such as tantalum pentachloride ($TaCl_5$) and other tantalum halides and derivatives thereof. Tantalum containing compounds may also be a metal organic compound such as pentadimethylamino-tantalum (PDMAT; $Ta(NMe_2)_5$), pentaethylmethylamino-tantalum (PEMAT; $Ta[N(C_2H_5CH_3)_2]_5$), pentadiethylamino-tantalum (PDEAT; $Ta(NEt_2)_5$), and any and all of derivatives of PDMAT, PEMAT, or PDEAT. Other tantalum containing compounds include without limitation TBTDET ($Ta(NEt_2)_3NC_4H_9$ or $C_{16}H_{39}N_4Ta$). For the deposition of a refractory metal layer comprising tungsten, a tungsten containing compound is used. Tungsten containing compounds include tungsten based precursors such as tungsten hexafluoride ($WF_6$), tungsten hexachloride ($WCl_6$), and other tungsten halides and derivatives thereof. Other tungsten containing compounds include without limitation tungsten carbonyl ($W(CO)_6$).

B. Cyclical Layer Deposition of a Refractory Metal Nitride Layer

Chamber 100 may be used to deposit a refractory metal nitride layer by cyclical layer deposition.

i. Cyclical Layer Deposition of a Refractory Metal Nitride Layer Utilizing a Plasma In one embodiment, cyclical layer deposition of a refractory metal nitride layer may proceed in a process similar to cyclical layer deposition of a refractory metal layer. In one embodiment, cyclical layer deposition of a refractory metal nitride layer comprises sequentially providing a refractory metal containing compound and a hydrogen/nitrogen plasma in process chamber 100. Sequentially providing a refractory metal containing compound and atomic hydrogen/nitrogen may result in the alternating adsorption a refractory metal containing compound and reaction with atomic hydrogen/nitrogen to form thin layers of a refractory metal nitride on a substrate structure. For clarity reasons, deposition of a refractory metal nitride layer will be described in more detail in reference to one embodiment of a refractory metal nitride layer comprising a titanium nitride layer. Deposition of a tantalum nitride layer or tungsten nitride layer would follow similar processes.

Figure 7:
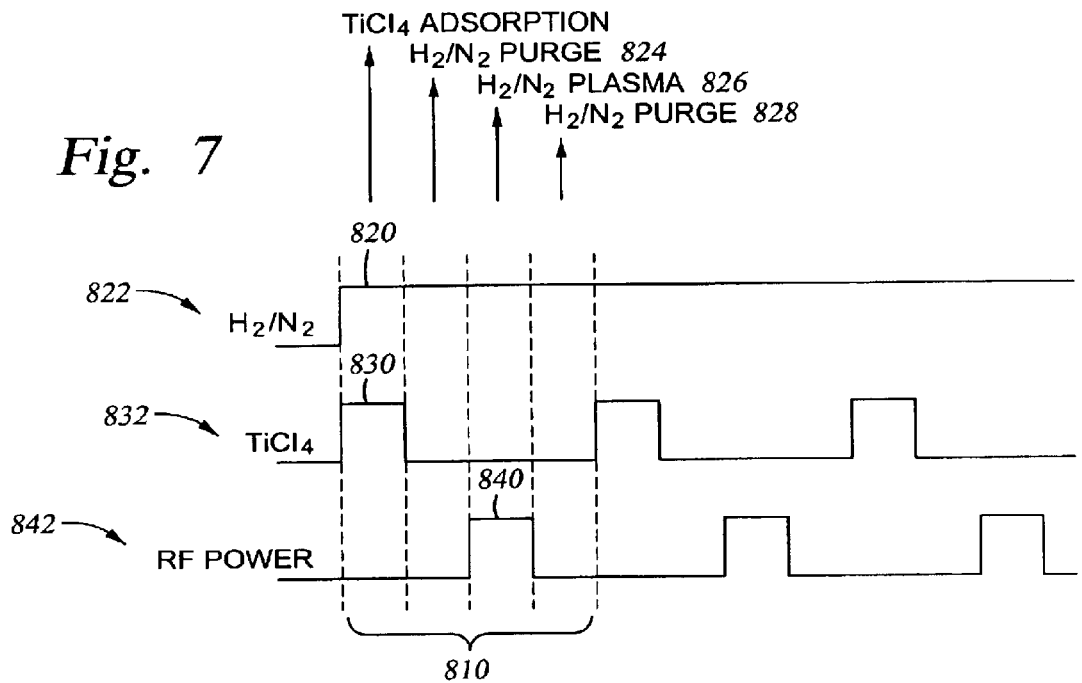
FIG. 7 is a graph of an exemplary process illustrating the control signals for sequentially providing a titanium containing compound and a hydrogen/nitrogen plasma.

FIG. 7 is a graph of an exemplary process illustrating the control signals for sequentially providing a titanium containing compound and a hydrogen/nitrogen plasma in process chamber 100 (FIG. 2) to deposit a titanium nitride layer. One cycle 810 of sequentially providing a titanium containing compound and a hydrogen/nitrogen plasma to process chamber 100 (FIG. 2) comprises providing a continuous flow 820 of a hydrogen/nitrogen containing gas 822, such as a mixture of hydrogen gas ($H_2$) and nitrogen gas ($N_2$), to the chamber 100 (FIG. 2) through the outer gas channels 143 (FIG. 2), through the top shower plate 160 (FIG. 3), and through the column holes 183 of the bottom shower plate 170 (FIG. 3) to the substrate receiving surface 111 (FIG. 2). During the continuous flow 820 of the hydrogen/nitrogen containing gas 822, a pulse 830 of a titanium containing compound 832, such as $TiCl_4$, is introduced to the chamber through the central gas channel 137 (FIG. 2) of the gas distribution system 130, through the gas conduit 210 (FIG. 3), and through the groove holes 185 of the bottom shower plate 170 (FIG. 3) to the substrate receiving surface 111 (FIG. 2). The titanium containing compound 832 may be introduced alone or with the aid of a carrier gas, such as argon, helium, hydrogen gas, nitrogen gas, or combinations thereof. If a carrier gas is used, the carrier gas may also be pulsed into the chamber 100 (FIG. 2) or the carrier gas may be a continuous flow in which the titanium containing compound 832 is dosed into the stream of the carrier gas. Preferably, a continuous flow of a carrier gas is used. After the pulse 830 of the titanium containing compound 832, the flow 820 of the hydrogen/nitrogen containing gas 822 continues to the chamber to act as a purge gas 824 to reduce gas phase reactions (i.e. between the titanium containing compound 832 and the hydrogen/nitrogen plasma 826 introduced thereafter). Then during the continuous flow 820 of the hydrogen/nitrogen containing gas 822, a pulse 840 of plasma power 842, such as an RF power, is provided to the top shower plate 160 (FIG. 2) to generate a hydrogen/nitrogen plasma 826 from the flow 820 of the hydrogen/nitrogen containing gas 822 between the top shower plate 160 and the bottom shower plate 170 (FIG. 2). The generated atomic hydrogen/nitrogen flows through the column holes 183 of the bottom shower plate 170 (FIG. 3) to the substrate receiving surface 111 (FIG. 2). After the pulse 840 of plasma power 842, the flow 820 of the hydrogen/nitrogen containing gas 822 continues to the chamber to act as a purge gas 828 to reduce gas phase reactions between the titanium containing compound 832 and the hydrogen/nitrogen plasma 826. The cycle 810 may be repeated to a desired thickness of the titanium nitride layer.

Not wishing to be bound by theory, it is believed that reaction of the titanium containing compound 832 and the hydrogen/nitrogen plasma 826 is self-limiting in that only one monolayer or less of the titanium containing compound 832 may be adsorbed onto the substrate surface to form one monolayer or less of titanium nitride due to the purge gas separating the pulses of the titanium containing compound 832 and pulses of the hydrogen nitrogen plasma 826. In other embodiments, the sequence of gas delivery may be varied to provide a partial self-limiting deposition process or a non-self-limiting deposition process. For example, the pulse 830 of the titanium containing compound 832 may be partially overlapped with the pulse 840 of plasma power 842 to provide a combined mode of deposition (i.e. a combined adsorption process and gas-phase/thermal co-reaction process between the titanium containing compound and the hydrogen/nitrogen plasma). In another example, the purge gas 824, 828 may only partially separate the pulses of the titanium containing compound 832 and the pulses of the hydrogen/nitrogen plasma 826.

It is understood that the titanium containing compound 832 may also be other titanium based precursors, such as other titanium based precursors disclosed elsewhere herein. Examples of other hydrogen/nitrogen containing gases which may also be used to generate a hydrogen/nitrogen plasma include, but are not limited to, ammonia ($NH_3$), $N_xH_y$ with x and y being integers (e.g., hydrazine ($N_2H_4$)); a mixture of hydrogen gas, nitrogen gas, and ammonia; other combinations thereof; and other gases or gas mixtures containing hydrogen and nitrogen.

One exemplary process of depositing a titanium nitride layer by cyclical layer deposition in chamber 100, as described in FIGS. 2–5, comprises providing a titanium containing compound comprising titanium tetrachloride ($TiCl_4$) for a time period between about 0.1 to about 5.0 seconds, preferably less than about 1 second, to the central gas channel 137 (FIG. 2). Because the titanium containing compound is provided as a pulse it is difficult to determine the corresponding flow rate that the titanium containing compound is provided. However, it is believed that the titanium tetrachloride is provided at a total flow rate between about 5 mg/m to about 500 mg/m. The titanium tetrachloride is provided with a carrier gas of a hydrogen gas/nitrogen gas mixture at a flow rate between about 500 sccm and about 10,000 sccm. A hydrogen/nitrogen containing gas comprising hydrogen gas ($H_2$) and nitrogen gas ($N_2$) with a carrier gas, such as helium, argon, or combinations thereof, is provided at a continuous flow at a total flow rate between about 100 sccm and about 5,000 sccm to the outer gas channels 143 (FIG. 2). For a hydrogen/nitrogen containing gas comprising hydrogen gas and nitrogen gas, the ratio of hydrogen gas to nitrogen gas is between about 0.5:2 and about 2:0.5. The plasma power is provided for a time period between about 0.1 seconds and about 5.0 seconds, preferably less than about 1 second. The plasma power is preferably a RF power between about 50 W and about 2,000 W, preferably between 300 W and about 1000 W, at a frequency of 13.56 MHz. The heater temperature preferably is maintained at a temperature range between about 20° C. and about 700° C., preferably between about 250° C. and about 500° C. The chamber is maintained at a chamber pressure between about 1.0 torr and about 20 torr, and preferably between about 2.0 torr and about 10.0 torr. This process provides a titanium nitride layer in a thickness which is believed to be between about 0.2 Å and about 2.0 Å per cycle. The alternating sequence may be repeated until a desired thickness is achieved. The thickness of the titanium nitride layer may be deposited to any thickness depending on the particular application.

For the deposition of a refractory metal nitride layer comprising tantalum nitride, a tantalum containing compound is used, such as the tantalum containing compounds described elsewhere herein. For the deposition of a refractory metal nitride layer comprising tungsten nitride, a tungsten containing compound is used, such as the tungsten containing compounds described elsewhere herein.

ii. Cyclical Layer Deposition of a Refractory Metal Nitride Layer Without Use of a Plasma In other embodiments, cyclical layer deposition of a refractory metal nitride layer comprises sequentially providing a refractory metal containing compound and a nitrogen containing gas in process chamber 100 without the use of a plasma. Sequentially providing a refractory metal containing compound and a nitrogen containing gas may result in the alternating adsorption of monolayers of a refractory metal containing compound and of monolayers of a nitrogen containing compound on a substrate structure. For clarity reasons, deposition of a refractory metal nitride layer will be described in more detail in reference to one embodiment of the refractory metal nitride layer comprising a titanium nitride layer. Deposition of a tantalum nitride layer or tungsten nitride layer would follow similar processes.

Figure 8:
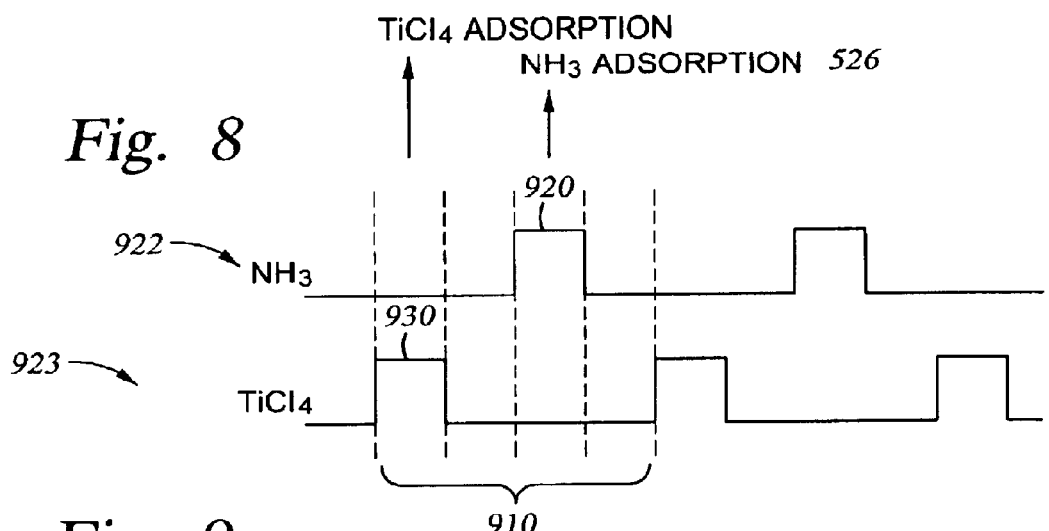
FIG. 8 is a graph of an exemplary process illustrating the control signals for sequentially providing a titanium containing compound and a nitrogen containing gas to deposit a titanium nitride layer.

FIG. 8 is a graph of an exemplary process illustrating the control signals for sequentially providing a titanium containing compound and a nitrogen containing gas utilizing process chamber 100 (FIG. 2) to deposit a titanium nitride layer. One cycle 910 of sequentially providing a titanium containing compound and a nitrogen containing gas to the process chamber 100 (FIG. 2) comprises providing a pulse 930 of a titanium containing compound 932, such as $TiCl_4$, to the chamber 100 (FIG. 2) through the central gas channel 137 (FIG. 2) of the gas distribution system 130, through the gas conduit 210 (FIG. 3), and through the groove holes 185 of the bottom shower plate 170 (FIG. 3) to the substrate receiving surface 111 (FIG. 2). The titanium containing compound 932 may be introduced alone or with the aid of a carrier gas, such as argon, helium, hydrogen gas, nitrogen gas, or combinations thereof. If a carrier gas is used, the carrier gas may also be pulsed into the chamber 100 (FIG. 2) or the carrier gas may be a continuous flow in which the titanium containing compound 932 is dosed into the stream of the carrier gas. Preferably, a continuous flow of a carrier gas is used to act as a purge gas to reduce gas phase reactions (i.e. between the titanium containing compound 932 and the nitrogen containing gas 922 introduced thereafter). After the pulse 930 of the titanium containing compound 932, a pulse 920 of a nitrogen containing gas 922, such as ammonia, is introduced through the outer gas channels 143 (FIG. 2) of the gas distribution system 130, through the top shower plate 160 (FIG. 2), and through the column holes 183 of the bottom shower plate 170 (FIG. 3) to the substrate receiving surface 111 (FIG. 2). The nitrogen containing gas 922 may be introduced alone or with the aid of a carrier gas, such as argon, helium, hydrogen gas, nitrogen gas, or combinations thereof. If a carrier gas is used, the carrier gas may also be pulsed into the chamber 100 (FIG. 2) or the carrier gas may be a continuous flow in which the nitrogen containing gas 922 is dosed into the stream of the carrier gas. Preferably, a continuous flow of a carrier gas is used to act as a purge gas to reduce gas phase reactions (i.e. between the titanium containing compound 932 and the nitrogen containing gas 922). The cycle 910 may be repeated to a desired thickness of the titanium nitride layer. Because the titanium containing compound and the nitrogen containing gas are introduced through the gas distribution system 130 (FIG. 2) through separate paths, gas phase reactions of the titanium containing compound and the nitrogen containing gas are minimized.

Not wishing to be bound by theory, it is believed that reaction of the titanium containing compound 932 and the nitrogen containing gas 922 is self-limiting in that only one monolayer or less of the titanium containing compound 932 and one monolayer or less of the nitrogen containing compound 922 may be adsorbed onto the substrate surface to form one monolayer or less of titanium nitride due to the purge gas separating the pulses 930 of the titanium containing compound 932 and pulses 920 of the nitrogen containing compound 922. In other embodiments, the sequence of gas delivery may be varied to provide a partial self-limiting deposition process or a non-self-limiting deposition process. For example, the pulse 930 of the titanium containing compound 932 may be partially overlapped with the pulse 920 of the nitrogen containing gas 922 to provide a combined mode of deposition (i.e. a combined adsorption process and gas-phase/thermal co-reaction process between the titanium containing compound and the nitrogen containing gas). In another example, the purge gas may only partially separate the pulses 930 of the titanium containing compound 932 and the pulses 920 of the nitrogen containing gas 922.

It is understood that the titanium containing compound 932 may also be other titanium based precursors, such as other titanium based precursors disclosed elsewhere herein. Examples of other nitrogen containing gases 922 which may also be used include, but are not limited to, $N_xH_y$ with x and y being integers (e.g., hydrazine ($N_2H_4$)); and other gases or gas mixtures containing nitrogen. For the deposition of a refractory metal nitride layer comprising tantalum nitride, a tantalum containing compound is used, such as the tantalum containing compounds described elsewhere herein. For the deposition of a refractory metal nitride layer comprising tungsten nitride, a tungsten containing compound is used, such as the tungsten containing compounds described elsewhere herein.

C. Plasma-Enhanced Chemical Vapor Deposition of a Refractory Metal Layer and/or a Refractory Metal Nitride Layer Chamber 100 may be used to deposit a refractory metal layer and/or a refractory metal nitride layer by plasma-enhanced chemical vapor deposition. For clarity reasons, deposition of a refractory metal layer and/or a refractory metal nitride layer will be described in more detail in reference to one embodiment of depositing a titanium layer.

Plasma-enhanced chemical vapor deposition of a titanium layer may comprise introducing a titanium-containing compound, such as titanium tetrachloride ($TiCl_4$), and introducing a hydrogen containing gas, such as hydrogen gas ($H_2$) in chamber 100.

In one embodiment, referring to FIG. 2, a plasma is generated from the hydrogen containing compound between the top shower plate 160 and the bottom shower plate 170. The hydrogen containing gas may be introduced through the outer gas channels 143 of the gas distribution system 130 and through the top shower plate 160. A plasma power may be provided to the top shower plate 160 and the bottom shower plate 170 may be grounded to provide a hydrogen plasma from the hydrogen containing gas between the top shower plate 160 and the bottom shower plate 170. The hydrogen plasma travels through the column holes 183 of the bottom shower plate 170 to the substrate receiving surface 111. The titanium containing compound may be introduced through the central gas channel 137 of the gas distribution system 130, through the gas conduit 210 (FIG. 3), and through the groove holes 185 of the bottom shower plate 170 (FIG. 3) to the substrate receiving surface 111.

The titanium containing compound and the hydrogen containing compound are introduced separately through discrete paths through the gas distribution system 130 of chamber 100 to reduce the likelihood of reaction of the hydrogen plasma and the titanium containing compound within the gas distribution system 130 and the formation of particles within the gas distribution system.

In another embodiment, still referring to FIG. 2, a plasma is generated from gas between the bottom shower plate 170 and the substrate support 112. A plasma power may be provided to the top shower plate 160 and the bottom shower plate 170 so that the plates are at the same or substantially same potential and the substrate support 112 is grounded so that the top and bottom shower plates 160, 170 act as the power electrode and the substrate support 112 acts as the ground electrode in generating a plasma from gases therebetween. The hydrogen containing compound and the titanium containing compound may be introduced separately through discrete paths through the gas distribution system. For example, the hydrogen containing compound may be introduced through the outer gas channels 143 and the titanium containing compound may be introduced through the central gas channel 137 of the gas distribution system 130. In another example, the hydrogen containing compound may be introduced through the central gas channel 137 and the titanium containing compound may be introduced through the outer gas channels 143 of the gas distribution system 130. Alternatively, the hydrogen containing compound and the titanium containing compound may be introduced together through the gas distribution system 130 through the central gas channel 137 and/or through the outer gas channels 142.

Figure 9:
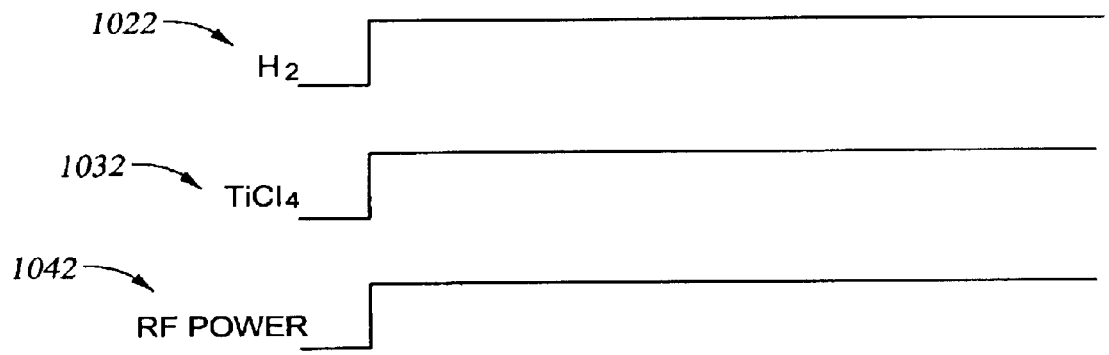
FIG. 9 is a graph of one exemplary process illustrating the control signals for plasma-enhanced chemical vapor deposition of a titanium layer.

FIG. 9 is a graph of one exemplary process illustrating the control signals for plasma-enhanced chemical vapor deposition of a titanium layer. As shown in FIG. 9, a hydrogen containing gas 1022 and the titanium containing compound 1032 may be continuously provided to chamber 100 whether separately through discrete paths through the gas distribution system 130 or together through the gas distribution system 130. The plasma power 1042 may be continuously provided to the power electrode whether the top shower plate 160 acts as the power electrode or whether the top shower plate 160 and the bottom shower plate 170 act together as the power electrode.

It is understood that the titanium containing compound 1032 may also be other titanium based precursors, such as the titanium containing compounds described elsewhere herein. The hydrogen containing gas 1022 may also be other reducing gases, such as the other reducing gases described elsewhere herein. For the deposition of a refractory metal layer comprising tantalum, a tantalum containing compound is used, such as the tantalum containing compounds described elsewhere herein. For the deposition of a refractory metal layer comprising tungsten, a tungsten containing compound is used, such as the tungsten containing compounds described elsewhere herein.

Plasma-enhanced chemical vapor deposition of a refractory metal nitride layer would follow a similar process as plasma-enhanced chemical vapor deposition of a refractory metal layer. For example, plasma-enhanced chemical vapor deposition of a titanium nitride layer may comprise introducing a titanium-containing compound, such as titanium tetrachloride ($TiCl_4$), and introducing a hydrogen/nitrogen containing gas, such as a mixture of hydrogen gas ($H_2$) and nitrogen gas ($N_2$) in chamber 100 (FIG. 2). A plasma may be generated between the top shower plate 160 and the bottom shower plate 170 or may be generated between the bottom shower plate 170 and the substrate support 112. It is understood that the titanium containing compound may also be other titanium based precursors, such as the titanium containing compounds described elsewhere herein. Examples of other hydrogen/nitrogen containing gases which may also be used to generate a hydrogen/nitrogen plasma include, but are not limited to, ammonia ($NH_3$), $N_xH_y$ with x and y being integers (e.g., hydrazine ($N_2H_4$)); a mixture of hydrogen gas, nitrogen gas, and ammonia; other combinations thereof; and other gases or gas mixtures containing hydrogen and nitrogen. For the deposition of a refractory metal nitride layer comprising tantalum nitride, a tantalum containing compound is used, such as the tantalum containing compounds described elsewhere herein. For the deposition of a refractory metal nitride layer comprising tungsten nitride, a tungsten containing compound is used, such as the tungsten containing compounds described elsewhere herein.

D. Combination of Cyclical Layer Deposition and Plasma-Enhanced Chemical Vapor Deposition Chamber 100 may be used to deposit a refractory metal and/or a refractory metal nitride layer by a process similar to the combination of cyclical layer deposition and plasma-enhanced chemical vapor deposition. For clarity reasons, deposition will be described in more detail in reference to one embodiment of depositing a refractory metal layer comprising a titanium layer.

Figure 10:
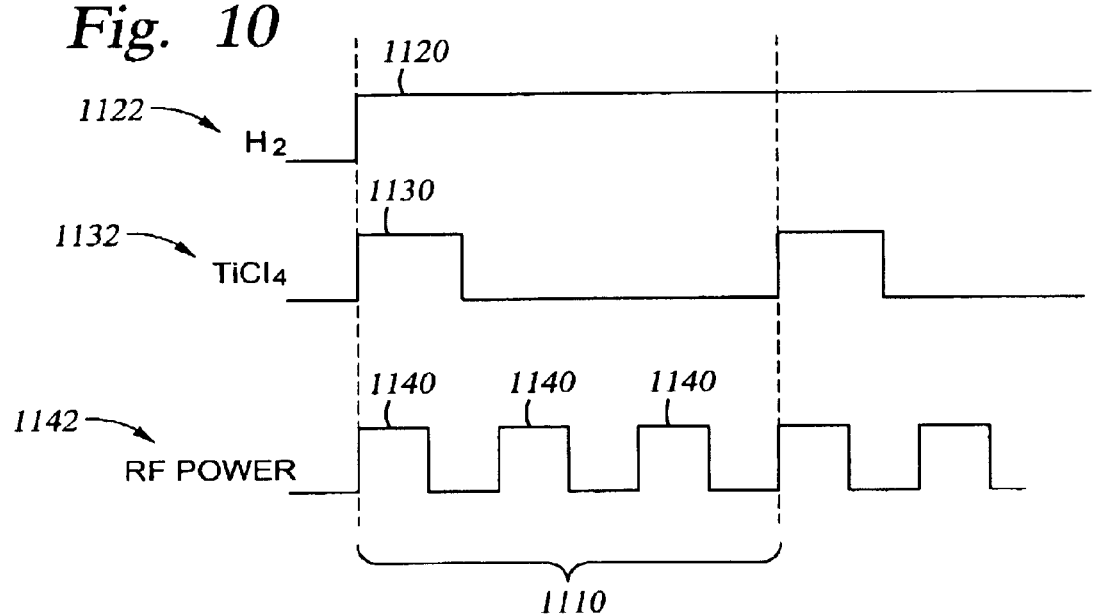
FIG. 10 is a graph of one exemplary process illustrating the control signals for a combination of cyclical layer deposition and plasma-enhanced chemical vapor deposition of a titanium layer.

FIG. 10 is a graph of one exemplary process illustrating the control signals for a combination of cyclical layer deposition and plasma-enhanced chemical vapor deposition of a titanium layer. As shown in FIG. 10, one cycle 1110 comprises providing a continuous flow 1120 of hydrogen containing gas 1122, such as hydrogen gas, to chamber 100 (FIG. 2) through the outer gas channels 143 (FIG. 2), through the top shower plate 160, and through the column holes 183 of the bottom shower plate 170 (FIG. 3) to the substrate receiving surface 111 (FIG. 2). During the continuous flow 1120 of hydrogen containing gas 1122, a pulse 1130 of a titanium containing compound 1132, such as $TiCl_4$, is introduced to chamber 100 (FIG. 2) through the central gas channel 137 (FIG. 2) of the gas distribution system 130, through the gas conduit 210 (FIG. 3), and through the groove holes 185 of the bottom shower plate 170 (FIG. 3) to the substrate receiving surface 111 (FIG. 2). Also, during the continuous flow 1120 of the hydrogen/nitrogen containing gas 1122, pulses 1140 of plasma power 1142, such as an RF power, is provided to both the top shower plate 160 and the bottom shower plate 170 (FIG. 2) to generate a hydrogen plasma from the flow 1120 of the hydrogen containing gas 1122 between the bottom shower plate 170 and the substrate support 112 (FIG. 2). One or more of the pulses 1140 of plasma power may overlap with the pulse 1130 of the titanium containing compound 1132 and one or more the pulses 1140 of plasma power may be provided separate from the pulse 1130 of the titanium containing compound 1132. Alternatively, during the continuous flow 1120 of the hydrogen containing gas 1122, pulses 1140 of plasma power 1142, such as an RF power, is provided to the top shower plate 160 (FIG. 2) to generate a hydrogen plasma from the flow 1120 of the hydrogen containing gas 1122 between the top shower plate 160 and the bottom shower plate 170 (FIG. 2). The cycle 1110 may be repeated to a desired thickness of the titanium nitride layer.

In one aspect, a hydrogen plasma and a titanium containing compound is being provided at separate times to the substrate receiving surface 111 to provide a deposition process similar to cyclical layer deposition which provides good conformal coverage over substrate structures. In another aspect, a hydrogen plasma and a titanium containing compound is being provided at the same time to the substrate receiving surface 111 to provide a deposition process similar to plasma-enhanced chemical vapor deposition which provides a high deposition rate.

It is understood that the titanium containing compound 1132 may also be other titanium based precursors, such as the titanium containing compounds described elsewhere herein. The hydrogen containing gas 1122 may also be other reducing gases, such as the other reducing gases described elsewhere herein. For the deposition of a refractory metal layer comprising tantalum, a tantalum containing compound is used, such as the tantalum containing compounds described elsewhere herein. For the deposition of a refractory metal layer comprising tungsten, a tungsten containing compound is used, such as the tungsten containing compounds described elsewhere herein.

Combined cyclical layer deposition and plasma-enhanced chemical vapor deposition of a refractory metal nitride layer would follow a similar process as that for deposition of a refractory metal layer. For example, combined cyclical layer deposition and plasma-enhanced chemical vapor deposition of a titanium nitride layer may comprise introducing a titanium-containing compound, such as titanium tetrachloride ($TiCl_4$), and introducing a hydrogen/nitrogen containing gas, such as a mixture of hydrogen gas ($H_2$) and nitrogen gas ($N_2$) in chamber 100 (FIG. 2). Pulses of plasma power may be provided to the top shower plate 160 and the bottom shower plate 170 to generate pulses of plasma between the bottom shower plate 170 and the substrate support 112 or pulses of plasma power may be provided to the top shower plate 160 to generated pulses of plasma between the top shower plate 160 and the bottom shower plate 170. One or more of the pulses of plasma power may overlap with the pulse 1130 of the titanium containing compound 1132 and one or more of the pulses 1140 of plasma power may be provided separate from the pulse 1130 of the titanium containing compound 1132. The combined cyclical layer deposition and plasma-enhanced chemical vapor deposition of a refractory metal nitride layer provides both good conformal coverage and a high deposition rate.

It is understood that the titanium containing compound may also be other titanium based precursors, such as the titanium containing compounds described elsewhere herein. Examples of other hydrogen/nitrogen containing gases which may also be used to generate a hydrogen/nitrogen plasma include, but are not limited to, ammonia ($NH_3$), $N_xH_y$ with x and y being integers (e.g., hydrazine ($N_2H_4$)); a mixture of hydrogen gas, nitrogen gas, and ammonia; other combinations thereof; and other gases or gas mixtures containing hydrogen and nitrogen. For the deposition of a refractory metal nitride layer comprising tantalum nitride, a tantalum containing compound is used, such as the tantalum containing compounds described elsewhere herein. For the deposition of a refractory metal nitride layer comprising tungsten nitride, a tungsten containing compound is used, such as the tungsten containing compounds described elsewhere herein.

E. Multiple Processes Performed in a Single Chamber

Figure 11:
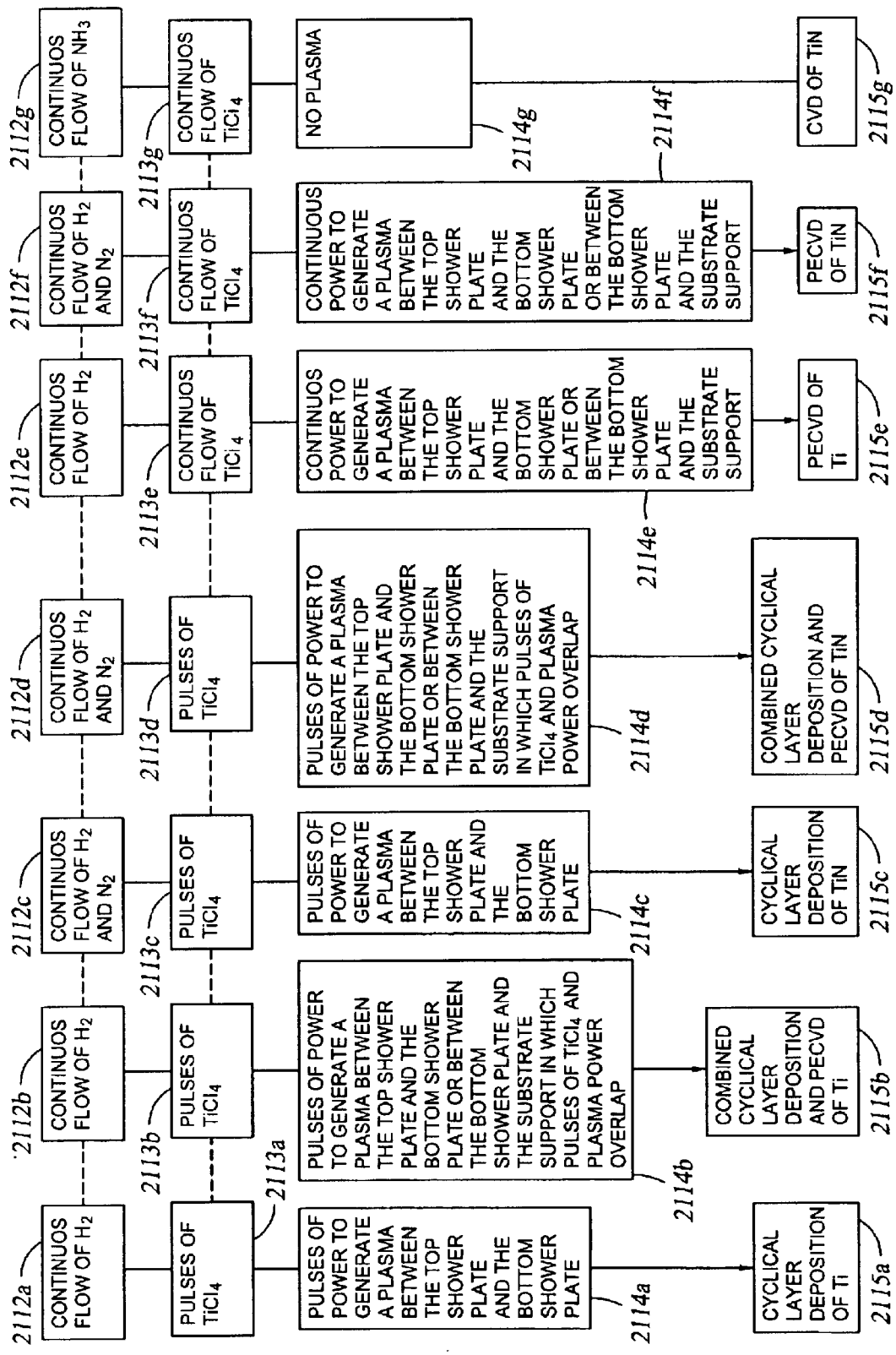
FIG. 11 is a chart of exemplary embodiments of processes which may be performed in the chamber shown in FIG. 2.

Chamber 100 as described in FIGS. 2–5 may be utilized to perform one or more of the processes as described above to deposit one or more layers of materials over a substrate structure in a single chamber. FIG. 11 is a chart of exemplary embodiments of processes which may be performed in chamber 100. For clarity reasons, the chart shows processes for the deposition of Ti and TiN, although other materials may be similarly deposited. Chamber 100 may be used to perform one or more of the processes 2115*a–g* in a single chamber. Other processes are also possible and other precursors may also be used. Chamber 100 may be utilized to perform in a single chamber one or more of the processes including, but not limited to, cyclical layer deposition of a refractory metal layer 2115*a*, combined cyclical layer deposition and plasma-enhanced chemical vapor deposition of a refractory metal layer 2115*b*, cyclical layer deposition of a refractory metal nitride layer 2115*c*, combined cyclical layer deposition and plasma-enhanced chemical vapor deposition of a refractory metal nitride layer 2115d, plasma-enhanced chemical vapor deposition of a refractory metal layer 2115e, plasma-enhanced chemical vapor deposition of a refractory metal nitride layer 2115f, and/or chemical vapor deposition of a refractory metal nitride layer 2115g. The chamber 100 may switch from one process to another process by changing one or more parameters 2112a–f, 2113a–f, 2114a–f. Of course, other parameters may also be changed, which include but are not limited to, flow rate of gases, substrate temperature, pressure of the chamber, etc.

For example, chamber 100 may be used to advantage to deposit in a single chamber a titanium layer by cyclical layer deposition 2115a and a titanium nitride by cyclical deposition 2115c by changing the flow of the continuous flow of a hydrogen containing gas 2112a to a continuous flow of a hydrogen/nitrogen containing gas 2112d. The first gas source 141 of chamber 100 of FIG. 2 may be adapted to provide varying amounts of a hydrogen containing gas, such as $H_2$, and a nitrogen containing gas, such as $N_2$, to deposit a refractory metal layer and a refractory metal nitride layer. Furthermore, the gas source may be adapted to gradually or rapidly tune the composition of a refractory metal/refractory metal nitride layer. In another example, chamber 100 may be used to advantage to deposit in a single chamber a nucleation layer of a material by cyclical layer deposition and to deposit a bulk layer of the material thereover by plasma-enhanced chemical vapor deposition or a combination of cyclical layer deposition and plasma-enhanced chemical vapor deposition. In one aspect, performing two or more processes in a single chamber increases the throughput of processing substrates.

F. Low Dielectric Constant Materials

Chamber 100 may be used to deposit a low dielectric constant material by cyclical layer deposition, chemical vapor deposition, or other suitable deposition techniques. One example of a low dielectric constant material is an oxidized organosilane or organosiloxane film. An oxidized organosilane or organosiloxane film may be deposited by sequentially providing pulses of an organo silicon compound and pulses of an oxidizing agent. Alternatively, an oxidized organosilane or organosiloxane film may be deposited by a continuous flow of an organo silicon compound and a continuous flow or pulses of an oxidizing agent. Examples of organo silicon compounds include methylsilane, dimethylsilane, triethylsilane, disilanozethane, bis(methylsilano)methane, 1,2-disilanoethane, 1,2-bis(methylsilano)ethane, 2,2-disilanopropane, 1,3,5-trisilano-2,4,6-trimethylene, 1,3-dimethyldisiloxane, 1,1,3,3-tetramethyldisiloxane, 1,3-bis(silanomethylene)di-siloxane, bis(1-methyldisiloxanyl)methane, 2,2-bis(1-methyl-disiloxanyl)propane, 2,4,6,8-tetramethylcyclotetrasiloxane, 2,4,6,8,10-pentamethyl-cyclopenta-siloxane, 1,3,5,7-tetrasilano-2,6-dioxy-4,8-dimetylene, 2,4,6-trisilanetetrahydropyran, 2,5-disilanotetrahydrofuran, fluorinated carbon derivatives thereof, other suitable compounds, and combinations thereof. Examples of oxidizing agents include oxygen, nitrous oxide, ozone, carbon dioxide, and water. Preferably, the oxidizing agents are dissociated, such as by a RF power. RF power can be provided continuously or in pulses. A preferred oxidized organosilane film is produced by reaction of methylsilane, dimethylsilane, or 1,1,3,3-tetramethyl-disiloxane, and nitrous oxide at a constant RF power level or a pulsed RF power level.

G. Metal Oxides

Chamber 100 may be used to deposit metal oxides utilizing atomic oxygen by cyclical layer deposition, chemical vapor deposition, or other suitable deposition techniques. Metal oxide layers include, but are not limited to titanium oxides, aluminum oxides, zirconium oxides, hafnium oxides, lanthanum oxides, barium strontium titanates, strontium bismuth tantalates, and lead zirconium titanates, and composite layers utilizing suitable metal containing compounds and suitable oxygen containing compounds.

Applications

A refractory metal layer and/or a refractory metal nitride layer may be used to advantage in a variety of applications. The refractory metal layers and refractory metal nitride layers may be used separately (i.e., a TiN layer for use as an electrode in capacitor structures) or may be used together (i.e., a Ti/TiN layer for use as a contact layer, an adhesion layer, and/or a liner/barrier layer for the deposition of materials thereover). When a refractory metal layer and a refractory metal nitride layer are used together, the layers may be deposited in the same chamber or in separate chambers.

Figure 12A:
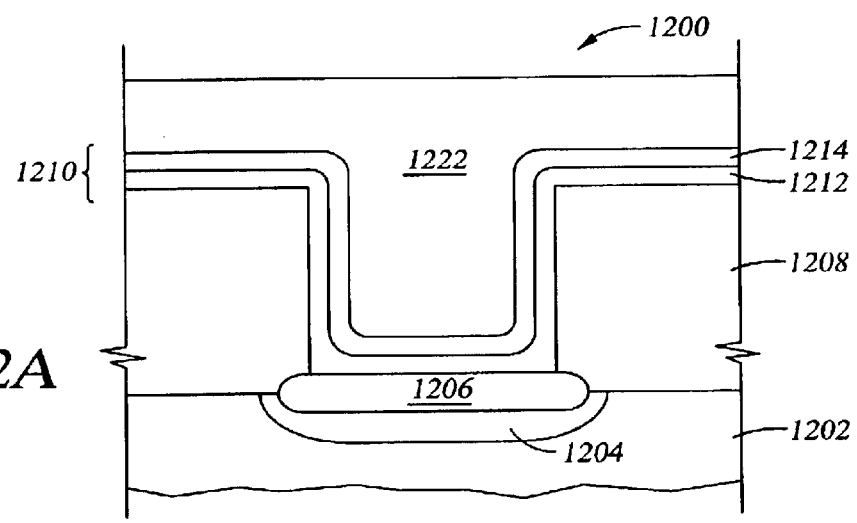
FIG. 12A is a schematic cross-sectional view of one embodiment of a specific application utilizing a titanium layer and a titanium nitride layer together at one stage in the fabrication of an integrated circuit.

FIG. 12A is a schematic cross-sectional view of one embodiment of a specific application utilizing a titanium layer and a titanium nitride layer together at one stage in the fabrication of an integrated circuit. As shown in FIG. 12A, the film stack 1200 includes an underlying substrate 1202, such as a semiconductor substrate, and includes a doped source/drain region 1204. A metal silicide layer 1206, such as a titanium silicide layer, nickel silicide layer, cobalt silicide layer, or tungsten silicide layer, may be formed over the region 1204. A dielectric layer 1208, such as a silicon dioxide layer or low-k dielectric material, may be formed over the metal silicide layer 1206. The dielectric layer 1208 may be patterned and etched to form an aperture exposing the metal silicide layer 1206. A liner/barrier layer 1210 comprising a titanium layer 1212 and comprising a titanium nitride layer 1214 may be formed over the aperture. A conductive layer 1222 comprising a conductive material, such as tungsten, copper, aluminum, and combinations thereof, may be deposited over the liner/barrier layer 1210. In other embodiments, the metal silicide layer may be formed over a transistor gate.

Figure 12B:
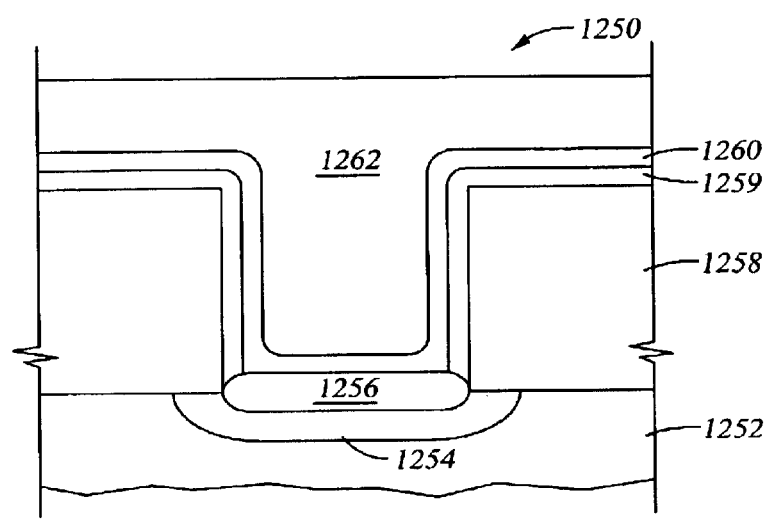
FIG. 12B is a schematic cross-sectional view of another embodiment of a specific application utilizing a titanium layer and a titanium nitride layer together at one stage in the fabrication of an integrated circuit.

FIG. 12B is a schematic cross-sectional view of another embodiment of a specific application utilizing a titanium layer and a titanium nitride layer together at one stage in the fabrication of an integrated circuit. As shown in FIG. 12B, the film stack 1250 includes an underlying substrate 1252, such as a semiconductor substrate, and includes a doped source/drain region 1254. A dielectric layer 1258, such as a silicon dioxide layer, may be formed over the substrate 1252. The dielectric layer 1258 may be patterned and etched to form an aperture. A titanium layer 1259 may be deposited over the aperture to form titanium silicide 1256 in situ. A titanium nitride layer 1260 may be deposited over the titanium layer 1259. A conductive layer 1262, such as a tungsten layer, may be deposited over the titanium nitride layer 1260. In other embodiments, the titanium silicide may be formed over a transistor gate.

The titanium layer 1212, 1259 and the titanium nitride layer 1214, 1260 may be deposited in the same chamber or in separate chambers. In one embodiment, the titanium layer 1212, 1259 is deposited by cyclical layer deposition while the titanium nitride layer 1214, 1260 is deposited by cyclical layer deposition. In another embodiment, the titanium layer 1212, 1259 is deposited by cyclical layer deposition while the titanium nitride layer 1214, 1260 is deposited by chemical vapor deposition or plasma-enhanced chemical vapor deposition. In still another embodiment, the titanium layer 1212, 1259 is deposited by cyclical layer deposition while the titanium nitride layer 1214, 1260 is deposited by a combination of cyclical layer deposition and chemical vapor deposition or a combination of cyclical layer deposition and plasma-enhanced chemical vapor deposition.

In another embodiment, cyclical layer deposition may be used to advantage to deposit a refractory metal layer and/or a refractory metal nitride layer at a low temperature, such as 500° C. or less, over formed devices, such as logic devices, which may begin to break down at temperature greater than 500° C.

While foregoing is directed to the preferred embodiment of the present invention, other and further embodiments of the invention may be devised without departing from the basic scope thereof, and the scope thereof is determined by the claims that follow.

What is claimed is:

1. A substrate processing chamber, comprising:
    a top shower plate, wherein the top shower plate comprises holes in communication with a top surface and a bottom surface of the top shower plate;
    a bottom shower plate, wherein the bottom shower plate comprises columns having column holes in communication with a top surface and a bottom surface of the bottom shower plate and comprises grooves having groove holes in communication with the bottom surface of the bottom shower plate;
    an insulator disposed between the top shower plate and the bottom shower plate;
    a gas box having a first gas channel;
    a gas conduit coupled to the first gas channel of the gas box, disposed through an aperture of the top shower plate, and coupled to an aperture of the bottom shower plate, the aperture of the bottom shower plate in communication with the grooves of the bottom shower plate, wherein the gas conduit comprises an insulating material;
    a power source coupled to the top shower plate; and
    a controller adapted to control the power source to provide pulses of power to the top shower plate.

2. The substrate processing chamber of claim 1, wherein the first gas channel is adapted to deliver one or more gases from the gas box through the gas conduit to the grooves of the bottom shower plate.

3. The substrate processing chamber of claim 1, wherein the aperture of the bottom shower plate is located at a central portion on a top surface of the bottom shower plate.

4. The substrate processing chamber of claim 1, wherein the gas box further comprises a second gas channel, the second gas channel adapted to deliver one or more gases from the gas box to the top surface of the top shower plate.

5. The substrate processing chamber of claim 4, wherein the first gas channel is located at a central portion of the gas box and wherein the second gas channel comprises one or more outer gas channels adjacent the first gas channel.

6. The substrate processing chamber of claim 4, wherein the first gas channel is coupled to a refractory metal containing gas source.

7. The substrate processing chamber of claim 6, wherein the refractory metal containing gas source is a titanium containing gas source.

8. The substrate processing chamber of claim 6, further comprising a valve coupling the refractory metal containing gas source and the first gas channel.

9. The substrate processing chamber of claim 8, wherein the valve is adapted to selectively provide pulses or a continuous flow of a refractory metal containing compound from the refractory metal containing gas source.

10. The substrate processing chamber of claim 4, wherein the second gas channel is coupled to a hydrogen containing gas source.

11. The substrate processing chamber of claim 10, further comprising a valve coupling the hydrogen containing gas source and the second gas channel.

12. The substrate processing chamber of claim 11, wherein the valve is adapted to selectively provide pulses or a continuous flow of a hydrogen containing gas from the hydrogen containing gas source.

13. The substrate processing chamber of claim 4, wherein the second gas channel is coupled to a hydrogen/nitrogen containing gas source.

14. The substrate processing chamber of claim 13, wherein the hydrogen/nitrogen containing gas source is adapted to selectively provide a hydrogen/nitrogen containing gas comprising a hydrogen gas to a nitrogen gas in varying ratios.

15. The substrate processing chamber of claim 13, further comprising a valve coupling the hydrogen/nitrogen containing gas source and the second gas channel.

16. The substrate processing chamber of claim 15, wherein the valve is adapted to selectively provide pulses or a continuous flow of a hydrogen/nitrogen containing gas from the hydrogen/nitrogen containing gas source.

17. The substrate processing chamber of claim 1, wherein power to the top shower plate is adapted to generate pulses of plasma between the top shower plate and the bottom shower plate.

* * * * *

UNITED STATES PATENT AND TRADEMARK OFFICE
CERTIFICATE OF CORRECTION

PATENT NO. : 6,998,014 B2 Page 1 of 1
APPLICATION NO. : 10/197940
DATED : February 14, 2006
INVENTOR(S) : Chen et al.

It is certified that error appears in the above-identified patent and that said Letters Patent is hereby corrected as shown below:

On the Title Page

Item [56], References Cited, OTHER PUBLICATIONS: Please include the following reference:

--Bader, et al. "Integrated Processing Equipment,-- Solid State Technology (May 1990).--

Column 8, Line 40: After "disclosed", change "is" to --in--

Column 8, Line 45: After "Processes,", insert --"--

Column 11, Line 40: Change "Ta(Net$_2$)$_{51}$" to --Ta(Net$_2$)$_5$--

Column 17, Line 44: After "more", insert --of--

Column 18, Line 23: Change "generated" to --generate--

Column 19, Line 45: Change "disilanozethane" to --disilanomethane--

Column 19, Line 53: Change "dimetylene" to --dimethylene--

Signed and Sealed this

Third Day of October, 2006

JON W. DUDAS
*Director of the United States Patent and Trademark Office*

UNITED STATES PATENT AND TRADEMARK OFFICE
CERTIFICATE OF CORRECTION

PATENT NO. : 6,998,014 B2 Page 1 of 1
APPLICATION NO. : 10/197940
DATED : February 14, 2006
INVENTOR(S) : Chen et al.

It is certified that error appears in the above-identified patent and that said Letters Patent is hereby corrected as shown below:

On the Title Page

Item [56], References Cited, OTHER PUBLICATIONS: Please include the following reference:

--Bader, et al. "Integrated Processing Equipment," Solid State Technology (May 1990).--

Column 8, Line 40: After "disclosed", change "is" to --in--

Column 8, Line 45: After "Processes,", insert --"--

Column 11, Line 40: Change "$Ta(Net_2)_{51}$" to --$Ta(Net_2)_5$--

Column 17, Line 44: After "more", insert --of--

Column 18, Line 23: Change "generated" to --generate--

Column 19, Line 45: Change "disilanozethane" to --disilanomethane--

Column 19, Line 53: Change "dimetylene" to --dimethylene--

This certificate supersedes Certificate of Correction issued October 3, 2006.

Signed and Sealed this

Second Day of January, 2007

JON W. DUDAS
*Director of the United States Patent and Trademark Office*